(12) United States Patent
Ono et al.

(10) Patent No.: US 11,830,755 B2
(45) Date of Patent: Nov. 28, 2023

(54) ELECTROSTATIC CHUCK AND SEMICONDUCTOR MANUFACTURING APPARATUS

(71) Applicant: TOTO LTD., Kitakyushu (JP)

(72) Inventors: Akihito Ono, Kitakyushu (JP); Jumpei Uefuji, Kitakyushu (JP); Tomoki Umetsu, Kitakyushu (JP); Tatsuya Hayakawa, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 19 days.

(21) Appl. No.: 17/693,623

(22) Filed: Mar. 14, 2022

(65) Prior Publication Data
US 2022/0310433 A1 Sep. 29, 2022

(30) Foreign Application Priority Data

Mar. 24, 2021 (JP) .................................. 2021-050177
Sep. 21, 2021 (JP) .................................. 2021-153433

(51) Int. Cl.
*H01L 21/683* (2006.01)
*H01J 37/32* (2006.01)

(52) U.S. Cl.
CPC .... *H01L 21/6833* (2013.01); *H01J 37/32724* (2013.01)

(58) Field of Classification Search
CPC ........... H01J 37/23724; H01L 21/6833; H01L 21/67109

USPC .......................................................... 361/234
See application file for complete search history.

(56) References Cited

U.S. PATENT DOCUMENTS

2002/0170882 A1* 11/2002 Akiba ................. H01L 21/6833
118/724

FOREIGN PATENT DOCUMENTS

JP         2001-110883 A      4/2001
WO    WO-2019194812 A1 *    10/2019  ............... B23Q 3/15

* cited by examiner

*Primary Examiner* — Kevin J Comber
(74) *Attorney, Agent, or Firm* — Carrier, Shende & Associates P.C.; Fulchand P. Shende; Joseph P. Carrier

(57) ABSTRACT

An electrostatic chuck includes a ceramic dielectric substrate and a base plate. The ceramic dielectric substrate includes a first major surface, a second major surface, a groove part, and a plurality of cooling gas holes. The groove part includes first and second circumferential grooves, and first and second radial-direction grooves. The plurality of cooling gas holes includes first and second holes. The first hole overlaps the first radial-direction groove. The second hole overlaps the second radial-direction groove. The base plate includes a gas inlet path that supplies the cooling gas to the first and second holes. The first circumferential groove includes first and second end portions. The second circumferential groove includes third and fourth end portions. The third end portion and the fourth end portion do not overlap the first end portion in the radial direction.

16 Claims, 14 Drawing Sheets

ELECTROSTATIC CHUCK AND SEMICONDUCTOR MANUFACTURING APPARATUS

CROSS-REFERENCE TO RELATED APPLICATIONS

This application is based upon and claims the benefit of priority from Japanese Patent Application No. 2021-050177, filed on Mar. 24, 2021, and No. 2021-153433, filed on Sep. 21, 2021; the entire contents of which are incorporated herein by reference.

FIELD

Embodiments described herein relate generally to an electrostatic chuck and a semiconductor manufacturing apparatus.

BACKGROUND

An electrostatic chuck is used to clamp a processing object such as a semiconductor wafer, a glass substrate, etc., inside a plasma processing chamber that performs etching, CVD (Chemical Vapor Deposition), sputtering, ion implantation, ashing, etc. The electrostatic chuck clamps a substrate such as a silicon wafer or the like by an electrostatic force by applying electrical power for electrostatic clamping to an embedded electrode.

As semiconductor elements are downscaled in recent years, it is desirable to further improve the patterning precision of a wafer when etching, etc. It is known that the patterning precision of the wafer is dependent on the wafer temperature when patterning. Therefore, it is desirable to uniformly control the surface temperature of the electrostatic chuck to increase the patterning precision of the wafer.

A known technique for controlling the surface temperature of the electrostatic chuck includes providing grooves in the surface of the electrostatic chuck (the ceramic dielectric substrate) so that the grooves communicate with cooling gas holes to which a cooling gas is supplied, and by spreading the cooling gas over the surface of the electrostatic chuck via the grooves. For example, JP-A 2001-110883 discusses a groove pattern that causes the cooling gas to spread over the surface of the electrostatic chuck by providing multiple circumferential grooves extending in the circumferential direction in a concentric circular configuration and by connecting these circumferential grooves with radial-direction grooves that extend in the radial direction.

However, in the groove pattern of JP-A 2001-110883, the circumferential grooves are discontinuous partway; and the end portions of the circumferential grooves are aligned in straight lines in the radial direction. Therefore, in the groove pattern of JP-A 2001-110883, it is difficult for the cooling gas to spread to regions at which the end portions of the circumferential grooves are concentrated, and there is a risk that the uniformity of the cooling gas distribution in the circumferential direction may decrease.

SUMMARY

According to the embodiment, an electrostatic chuck includes a ceramic dielectric substrate and a base plate. The ceramic dielectric substrate is circular when viewed in plan. The base plate supports the ceramic dielectric substrate. The ceramic dielectric substrate includes a first major surface, a second major surface, a groove part, and a plurality of cooling gas holes. A processing object is placed on the first major surface. The second major surface is at a side opposite to the first major surface. The groove part is recessed from the first major surface toward the second major surface. The plurality of cooling gas holes extends between the groove part and the second major surface. A cooling gas is capable of passing through the plurality of cooling gas holes. The groove part includes a first circumferential groove, a second circumferential groove, a first radial-direction groove, and a second radial-direction groove. The first circumferential groove extends in a circumferential direction. The second circumferential groove extends in the circumferential direction. At least a portion of the second circumferential groove is next to the first circumferential groove in a radial direction. The first radial-direction groove extends in the radial direction and intersects the first circumferential groove. The second radial-direction groove extends in the radial direction and intersects the second circumferential groove. The plurality of cooling gas holes includes a first hole and a second hole. The first hole overlaps the first radial-direction groove when viewed in plan. The second hole overlaps the second radial-direction groove when viewed in plan. The base plate includes a gas inlet path that supplies the cooling gas to the first and second holes. The first circumferential groove includes a first end portion and a second end portion. The first end portion is positioned at one end side of the circumferential direction. The second end portion is positioned at an other end side of the circumferential direction. The second circumferential groove includes a third end portion and a fourth end portion. The third end portion is positioned at the one end side of the circumferential direction. The fourth end portion is positioned at the other end side of the circumferential direction. The third end portion and the fourth end portion do not overlap the first end portion in the radial direction.

DETAILED DESCRIPTION

Figure 1:
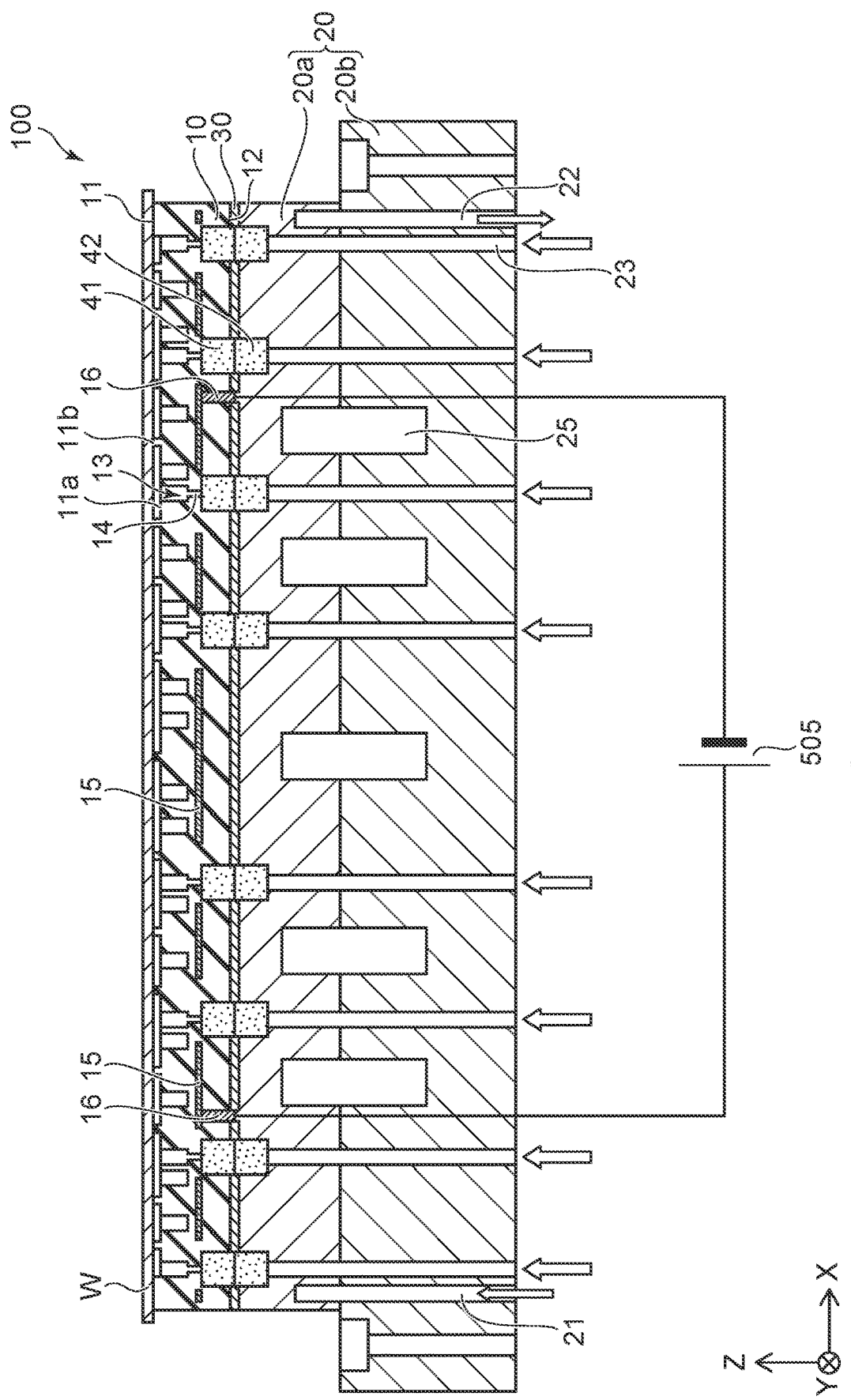
FIG. 1 is a cross-sectional view schematically illustrating an electrostatic chuck according to a first embodiment.

A first invention is an electrostatic chuck including a ceramic dielectric substrate and a base plate; the ceramic dielectric substrate is circular when viewed in plan; the base plate supports the ceramic dielectric substrate; the ceramic dielectric substrate includes a first major surface configured to have a processing object placed thereon, a second major surface at a side opposite to the first major surface, a groove part recessed from the first major surface toward the second major surface, and multiple cooling gas holes extending between the groove part and the second major surface and configured to pass cooling gas there through; the groove part includes a first circumferential groove extending in a circumferential direction, a second circumferential groove extending in the circumferential direction so that at least a portion of the second circumferential groove is next to the first circumferential groove in a radial direction, a first radial-direction groove extending in the radial direction and intersecting the first circumferential groove, and a second radial-direction groove extending in the radial direction and intersecting the second circumferential groove; the multiple cooling gas holes include a first hole overlapping the first radial-direction groove when viewed in plan, and a second hole overlapping the second radial-direction groove when viewed in plan; the base plate includes a gas inlet path through which the cooling gas is supplied to the first and second holes; the first circumferential groove includes a first end portion positioned at one end side thereof in the circumferential direction, and a second end portion positioned at another end side thereof in the circumferential direction; the second circumferential groove includes a third end portion positioned at the one end side thereof in the circumferential direction, and a fourth end portion positioned at the other end side thereof in the circumferential direction; and the third end portion and the fourth end portion do not overlap the first end portion in the radial direction.

According to the electrostatic chuck, the end portions of the first circumferential groove and the end portions of the second circumferential groove can be prevented from aligning in straight lines in the radial direction by the third and fourth end portions of the second circumferential groove not overlapping the first end portion of the first circumferential groove in the radial direction. The occurrence of regions to which the cooling gas does not easily spread can be suppressed thereby, and the uniformity of the cooling gas distribution in the circumferential direction can be increased. Also, the structures of ceramic dielectric substrates of recent years are made more complex to increase the patterning precision; and there are cases where multiple cooling gas holes cannot be located on the same circumference. When the multiple cooling gas holes are not located on the same circumference, there is a risk that the uniformity of the cooling gas distribution in the circumferential direction may decrease according to the shape of the groove pattern. Conversely, according to the electrostatic chuck, the uniformity of the cooling gas distribution in the circumferential direction can be increased even when the multiple cooling gas holes are not located on the same circumference.

A second invention is an electrostatic chuck including a ceramic dielectric substrate and a base plate; the ceramic dielectric substrate is circular when viewed in plan; the base plate supports the ceramic dielectric substrate; the ceramic dielectric substrate includes a first major surface configured to have a processing object placed thereon, a second major surface at a side opposite to the first major surface, a groove part recessed from the first major surface toward the second major surface, and multiple cooling gas holes extending between the groove part and the second major surface and configured to pass cooling gas there through; the groove part includes a first circumferential groove extending in a circumferential direction, a second circumferential groove extending in the circumferential direction so that at least a portion of the second circumferential groove is next to the first circumferential groove in a radial direction, a first radial-direction groove extending in the radial direction and intersecting the first circumferential groove, and a second radial-direction groove extending in the radial direction and intersecting the second circumferential groove; the multiple cooling gas holes include a first hole overlapping the first circumferential groove when viewed in plan, and a second hole overlapping the second circumferential groove when viewed in plan; the base plate includes a gas inlet path through which the cooling gas is supplied to the first and second holes; the first circumferential groove includes a first end portion positioned at one end side thereof in the circumferential direction, and a second end portion positioned at another end side thereof in the circumferential direction; the second circumferential groove includes a third end portion positioned at the one end side thereof in the circumferential direction, and a fourth end portion positioned at the other end side thereof in the circumferential direction; and the third end portion and the fourth end portion do not overlap the first end portion in the radial direction.

According to the electrostatic chuck, the end portions of the first circumferential groove and the end portions of the second circumferential groove can be prevented from being aligned in straight lines in the radial direction by the third and fourth end portions of the second circumferential groove not overlapping the first end portion of the first circumferential groove in the radial direction. The occurrence of regions to which the cooling gas does not easily spread can be suppressed thereby, and the uniformity of the cooling gas distribution in the circumferential direction can be increased. According to the electrostatic chuck, the uniformity of the cooling gas distribution in the circumferential direction can be increased even when the multiple cooling gas holes are not located on the same circumference.

A third invention is the electrostatic chuck of the first or second invention, wherein a distance to the first hole from an intersection between the first radial-direction groove and the first circumferential groove is equal to a distance to the second hole from an intersection between the second radial-direction groove and the second circumferential groove.

According to the electrostatic chuck, by setting the distance to the first hole from the intersection between the first radial-direction groove and the first circumferential groove to be equal to the distance to the second hole from the intersection between the second radial-direction groove and the second circumferential groove, the uniformity of the cooling gas distribution in the circumferential direction can be increased even when the first hole and the second hole are not located on the same circumference.

A fourth invention is the electrostatic chuck of any one of the first to third inventions, wherein the third end portion and the fourth end portion do not overlap the second end portion in the radial direction.

According to the electrostatic chuck, the end portions of the first circumferential groove and the end portions of the second circumferential groove can be prevented from being aligned in straight lines in the radial direction by the third and fourth end portions of the second circumferential groove not overlapping the second end portion of the first circumferential groove in the radial direction. The occurrence of regions to which the cooling gas does not easily spread can be further suppressed thereby, and the uniformity of the cooling gas distribution in the circumferential direction can be further improved.

A fifth invention is the electrostatic chuck of any one of the first to fourth inventions, wherein the first circumferential groove includes a central region that includes a center of the first circumferential groove in the circumferential direction, and the third end portion overlaps the central region in the radial direction.

According to the electrostatic chuck, the uniformity of the cooling gas distribution in the circumferential direction can be further improved by the third end portion of the second circumferential groove overlapping the central region of the first circumferential groove in the radial direction.

A sixth invention is the electrostatic chuck of the fifth invention, wherein the third end portion is positioned closer to the second end portion in the circumferential direction than to the first end portion in the circumferential direction.

According to the electrostatic chuck, the uniformity of the cooling gas distribution in the circumferential direction can be further improved by positioning the third end portion of the second circumferential groove further toward the other end side of the circumferential direction than the center of the first circumferential groove in the circumferential direction.

A seventh invention is the electrostatic chuck of the sixth invention, wherein the fourth end portion does not overlap the first circumferential groove in the radial direction.

According to the electrostatic chuck, the uniformity of the cooling gas distribution in the circumferential direction can be further improved by positioning the fourth end portion of the second circumferential groove further toward the other end side of the circumferential direction than the second end portion of the first circumferential groove.

An eighth invention is the electrostatic chuck of any one of the first to seventh inventions, further including a heater which heats the ceramic dielectric substrate.

According to the electrostatic chuck, the uniformity of the cooling gas distribution in the circumferential direction can be increased even when a heater is included.

A ninth invention is a semiconductor manufacturing apparatus including the electrostatic chuck of one of the first to eighth inventions, and a gas supplier which supplies the cooling gas to the first and second holes via the gas inlet path.

According to the semiconductor manufacturing apparatus, the surface temperature of the electrostatic chuck can be more uniformly controlled, and the patterning precision of the wafer when etching, etc., can be increased.

Exemplary embodiments will now be described with reference to the drawings. Components similar to those described in regard to a drawing therein above are marked with like reference numerals; and a detailed description is omitted as appropriate.

FIG. 1 is a cross-sectional view schematically illustrating an electrostatic chuck according to a first embodiment.

As illustrated in FIG. 1, the electrostatic chuck 100 according to the first embodiment includes a ceramic dielectric substrate 10, a base plate 20, and a heater 30.

The ceramic dielectric substrate 10 is, for example, a flat-plate base material made of a polycrystalline ceramic sintered body. For example, $Al_2O_3$, $Y_2O_3$, YAG, etc., are examples of the material of the crystal included in the ceramic dielectric substrate 10. By using such a material, the infrared transmissivity, the insulation resistance, and the plasma resistance of the ceramic dielectric substrate 10 can be increased.

The ceramic dielectric substrate 10 includes a first major surface 11, a second major surface 12, a groove part 13, and multiple cooling gas holes 14. The first major surface 11 is externally exposed, and is a surface on which a processing object W such as a semiconductor wafer or the like is placed. The second major surface 12 is the surface at the side opposite to the first major surface 11. The groove part 13 is a recess that is recessed from the first major surface 11 toward the second major surface 12. The multiple cooling gas holes 14 extend between the groove part 13 and the second major surface 12. A cooling gas can pass through the multiple cooling gas holes 14. The multiple cooling gas holes 14 communicate with the groove part 13. Therefore, the groove part 13 diffuses the cooling gas supplied from the multiple cooling gas holes 14 in the first major surface 11. The groove part 13 and the multiple cooling gas holes 14 are described below.

In this specification, a direction perpendicular to the first major surface 11 is taken as a Z-direction. In other words, the Z-direction is a direction that connects the first major surface 11 and the second major surface 12. One direction orthogonal to the Z-direction is taken as an X-direction; and a direction that is orthogonal to the Z-direction and the X-direction is taken as a Y-direction. In this specification, "in the plane" is, for example, in the X-Y plane. In this specification, "when viewed in plan" means a state viewed along the Z-direction.

The first major surface 11 includes, for example, a planar portion 11a and a protrusion 11b. The planar portion 11a is, for example, a surface that is parallel to the second major surface 12. The protrusion 11b protrudes from the planar portion 11a toward the side opposite to the second major surface 12. The processing object W is placed on the protrusion 11b and is supported by the protrusion 11b. The protrusion 11b contacts the back surface of the processing object W. By providing the protrusion 11b, a space can be defined between the planar portion 11a and the back surface of the processing object W placed on the electrostatic chuck 100. For example, particles that adhere to the processing object W can be controlled in a favorable state by appropriately selecting the height and number of the protrusions 11b, the surface area ratio and shape of the protrusions 11b, etc.

An electrode layer 15 is located inside the ceramic dielectric substrate 10. The electrode layer 15 is interposed between the first major surface 11 and the second major surface 12. In other words, the electrode layer 15 is inserted into the ceramic dielectric substrate 10. The electrode layer 15 is sintered as a continuous body with the ceramic dielectric substrate 10. The electrode layer 15 is not limited to being interposed between the first major surface 11 and the second major surface 12 and may be additionally provided at the second major surface 12.

A connection part 16 that extends to the second major surface 12 side of the ceramic dielectric substrate 10 is located at the electrode layer 15. The connection part 16 is a connection made by an appropriate method such as brazing, etc., of a via (solid), a via hole (hollow), or a metal terminal that is electrically connected with the electrode layer 15.

The electrostatic chuck 100 clamps the processing object W by an electrostatic force by generating a charge at the first major surface 11 side of the electrode layer 15 by applying a voltage (a clamping voltage) from a clamping power supply 505 to the electrode layer 15.

The electrode layer 15 is located along the first and second major surfaces 11 and 12. The electrode layer 15 is a clamping electrode for clamping the processing object W. The electrode layer 15 may be monopolar or bipolar. Also, the electrode layer 15 may be tripolar or another multi-pole type. The number of the electrode layers 15 and the arrangement of the electrode layers 15 are selected as appropriate.

The base plate 20 is located at the second major surface 12 side of the ceramic dielectric substrate 10 and supports the ceramic dielectric substrate 10. For example, the base plate 20 is made of a metal such as aluminum, etc.

For example, the base plate 20 is divided into an upper part 20a and a lower part 20b. A communicating path 25 is provided between the upper part 20a and the lower part 20b. One end side of the communicating path 25 is connected to an inlet path 21; and the other end side of the communicating path 25 is connected to an outlet path 22.

The base plate 20 also performs the role of temperature regulation of the electrostatic chuck 100. For example, when cooling the electrostatic chuck 100, a cooling medium such as helium gas or the like is caused to inflow through the inlet path 21, is caused to pass through the communicating path 25, and is caused to outflow from the outlet path 22. Thereby, the cooling medium can absorb the heat of the base plate 20 and cool the ceramic dielectric substrate 10 mounted on the base plate 20. On the other hand, when maintaining the temperature of the electrostatic chuck 100, a heat-retaining medium can be introduced to the communicating path 25.

At least one gas inlet path 23 is provided in the base plate 20. In the example, multiple gas inlet paths 23 are provided in the base plate 20. For example, the gas inlet paths 23 extend through the base plate 20 in the Z-direction. The multiple gas inlet paths 23 communicate with the multiple cooling gas holes 14 of the ceramic dielectric substrate 10. Thereby, the cooling gas that is introduced through the gas inlet path 23 of the base plate 20 passes through the cooling gas holes 14 of the ceramic dielectric substrate 10 and is diffused in the first major surface 11 along the groove part 13 that communicates with the cooling gas holes 14. As described below, the gas inlet path 23 may branch inside the base plate 20 (see FIG. 14).

Figure 13:
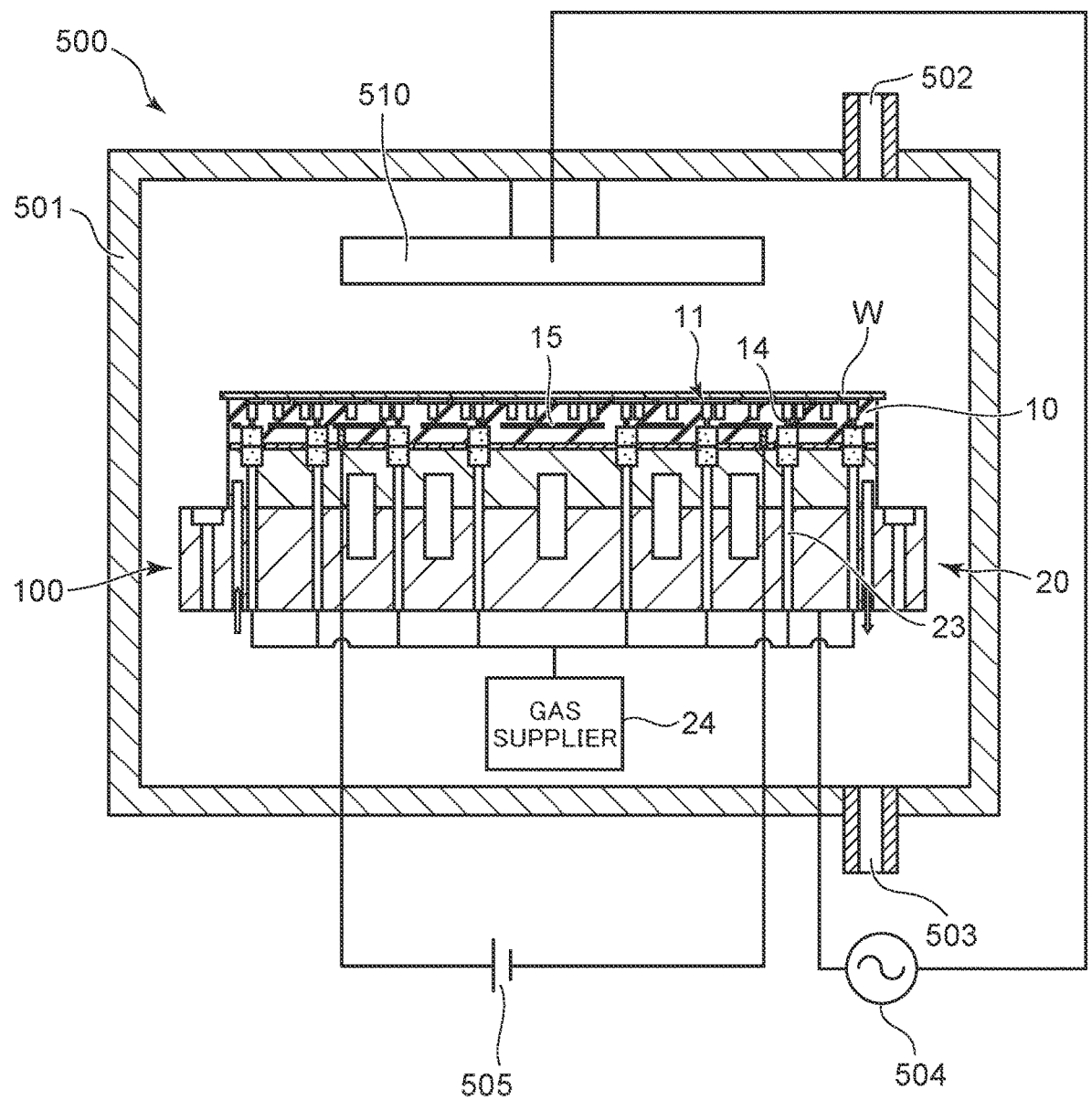
FIG. 13 is a cross-sectional view schematically illustrating a wafer processing apparatus that includes the electrostatic chuck according to the first embodiment.
Figure 14:
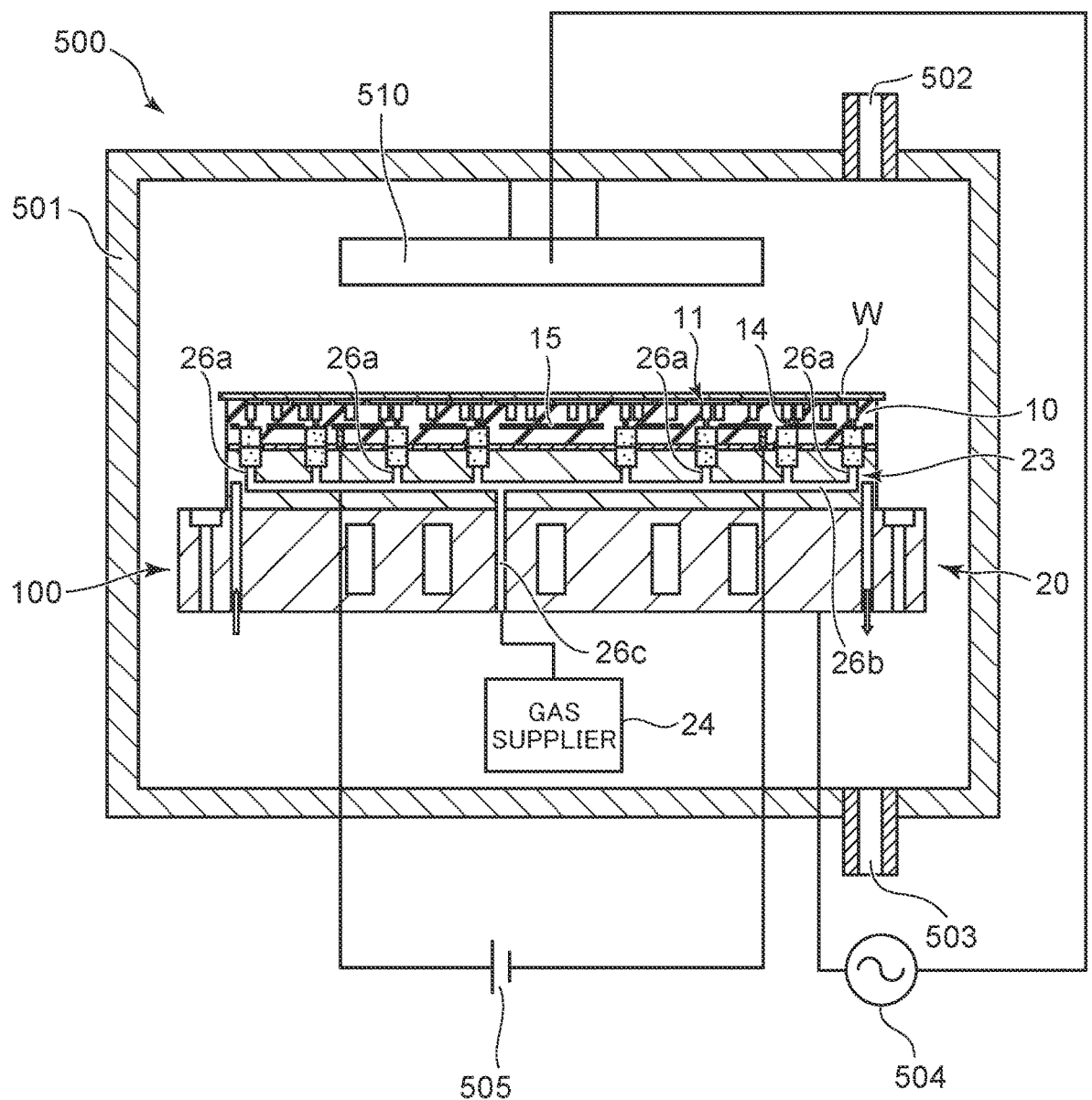
FIG. 14 is a cross-sectional view schematically illustrating a wafer processing apparatus that includes the electrostatic chuck according to the modification of the first embodiment.

The cooling gas is supplied from a gas supplier 24 to the cooling gas hole 14 (see FIGS. 13 and 14). The gas supplier 24 is connected to the gas inlet path 23 and supplies the cooling gas to the cooling gas holes 14 via the gas inlet path 23. For example, the gas supplier 24 controls the pressure of the supplied cooling gas, as well as the supply start and the supply stop of the cooling gas.

In the example, the multiple gas inlet paths 23 are connected to one gas supplier 24. In other words, in the example, the cooling gas is supplied from one gas supplier 24 to the multiple cooling gas holes 14 via the multiple gas inlet paths 23. In other words, in the example, the multiple cooling gas holes 14 are controlled by one gas supplier 24.

For example, the pressure of the cooling gas that is supplied is the same between the cooling gas holes 14.

According to the embodiment, one gas inlet path 23 may be connected (may communicate) with the multiple cooling gas holes 14. In such a case as well, the multiple cooling gas holes 14 that are connected to the one gas inlet path 23 are controlled by one gas supplier 24.

In the example, the connection part between the gas inlet path 23 and the cooling gas holes 14 includes a first porous portion 41 and a second porous portion 42. The first porous portion 41 is located inside the cooling gas hole 14. The second porous portion 42 is located inside the gas inlet path 23. The first porous portion 41 and the second porous portion 42 face each other in the Z-direction.

The materials of the first porous portion 41 and the second porous portion 42 can be, for example, a ceramic that is insulative. The first porous portion 41 and the second porous portion 42 include, for example, at least one of aluminum oxide ($Al_2O_3$), titanium oxide ($TiO_2$), or yttrium oxide ($Y_2O_3$). The first porous portion 41 and the second porous portion 42 are provided as necessary and are omissible.

The heater 30 heats the ceramic dielectric substrate 10. The heater 30 heats the processing object W via the ceramic dielectric substrate 10 by heating the ceramic dielectric substrate 10. In the example, the heater 30 is a body different from the ceramic dielectric substrate 10 and is located between the ceramic dielectric substrate 10 and the base plate 20. For example, the heater 30 is bonded to the base plate 20 via an adhesive layer. For example, the heater 30 is bonded to the ceramic dielectric substrate 10 via the adhesive layer.

The heater 30 may be inserted into the ceramic dielectric substrate 10. In other words, the heater 30 may be embedded in the ceramic dielectric substrate 10. The heater 30 is provided as necessary and is omissible.

Figure 2:
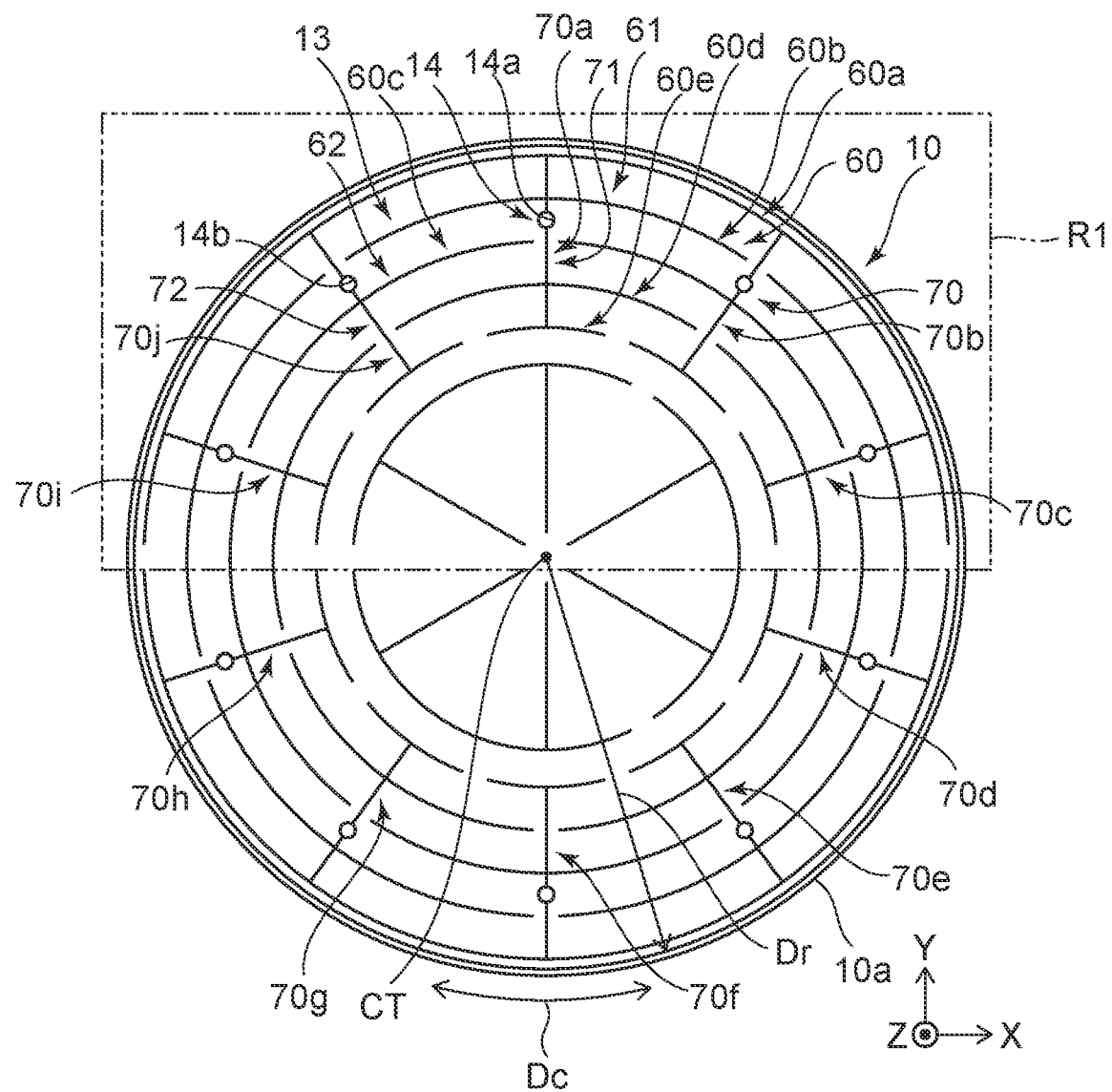
FIG. 2 is a plan view schematically illustrating the ceramic dielectric substrate according to the first embodiment.

FIG. 2 is a plan view schematically illustrating the ceramic dielectric substrate according to the first embodiment.

Figure 3:
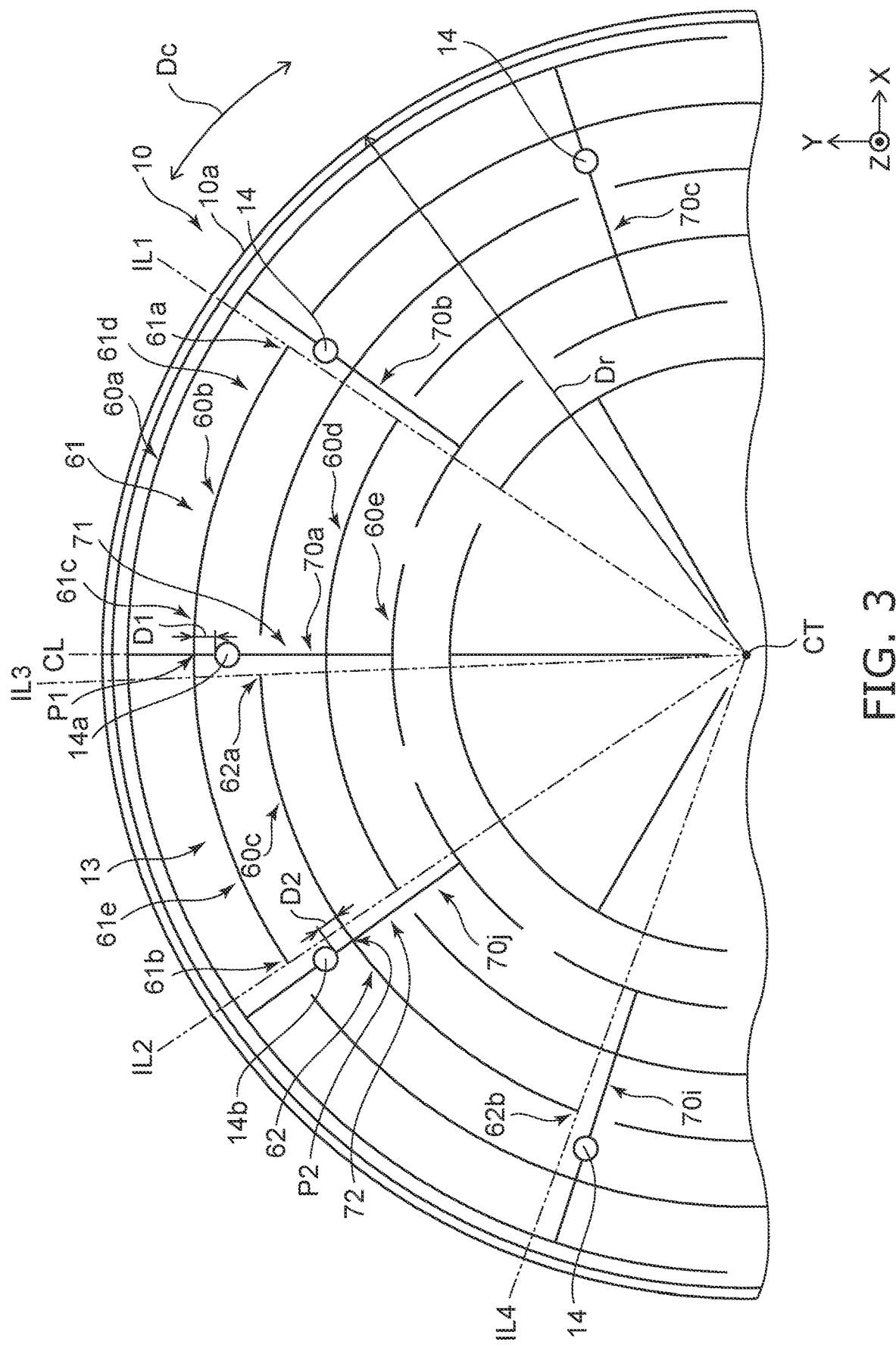
FIG. 3 is a plan view schematically illustrating a portion of the ceramic dielectric substrate according to the first embodiment.

FIG. 3 is a plan view schematically illustrating a portion of the ceramic dielectric substrate according to the first embodiment.

FIGS. 2 and 3 are plan views of the ceramic dielectric substrate 10 when viewed from the first major surface 11 side.

FIG. 3 is an enlarged view of region R1 shown in FIG. 2.

As illustrated in FIGS. 2 and 3, the ceramic dielectric substrate 10 is circular when viewed in plan.

The groove part 13 is provided in the first major surface 11 side of the ceramic dielectric substrate 10. The groove part 13 includes a circumferential groove portion 60 and a radial-direction groove portion 70. The circumferential groove portion 60 includes multiple circumferential grooves that extend in a circumferential direction Dc and are arranged in a radial direction Dr. The radial-direction groove portion 70 includes multiple radial-direction grooves that extend in the radial direction Dr and are arranged in the circumferential direction Dc. At least a portion of the multiple radial-direction grooves cross at least a portion of the multiple circumferential grooves. The circumferential direction Dc is a direction along a circumference of a circle having a center CT of the ceramic dielectric substrate 10 as the center. The radial direction Dr is a direction from the center CT of the ceramic dielectric substrate 10 toward an outer edge 10a of the ceramic dielectric substrate 10.

In the example, the circumferential groove portion 60 includes multiple circumferential grooves 60a to 60e arranged in the radial direction Dr. The circumferential grooves 60a to 60e are arranged in the order of the circumferential groove 60a, the circumferential groove 60b, the circumferential groove 60c, the circumferential groove 60d, and the circumferential groove 60e in the radial direction Dr from the outermost circumference toward the center CT. The circumferential grooves 60a to 60e are located on circumferences of concentric circles that have different radii and have the center CT as the center. The circumferential grooves 60a to 60e are arranged at uniform spacing in the radial direction Dr. Two of these circumferential grooves 60a to 60e that are next to each other in the radial direction Dr are taken as a first circumferential groove 61 and a second circumferential groove 62.

In the following description, the circumferential groove 60b is taken as the first circumferential groove 61; and the circumferential groove 60c that is next to the first circumferential groove 61 and is positioned inward of the first circumferential groove 61 and in the radial direction Dr is taken as the second circumferential groove 62; however, the first circumferential groove 61 and the second circumferential groove 62 are not limited to such a description. It is sufficient for the first and second circumferential grooves 61 and 62 to be any two circumferential grooves that are next to each other in the radial direction Dr. That is, for example, the circumferential groove 60c may be the first circumferential groove 61; and the circumferential groove 60d may be the second circumferential groove 62. The second circumferential groove 62 may be a circumferential groove that is positioned outward of the first circumferential groove 61 in the radial direction Dr and is next to the first circumferential groove 61. That is, for example, the circumferential groove 60c may be the first circumferential groove 61; and the circumferential groove 60b may be the second circumferential groove 62.

At least a portion of the second circumferential groove 62 overlaps the first circumferential groove 61 in the radial direction Dr. The entire second circumferential groove 62 may overlap the first circumferential groove 61 in the radial direction Dr, or only a portion of the second circumferential groove 62 may overlap the first circumferential groove 61 in the radial direction Dr. That is, a portion of the second circumferential groove 62 may not overlap the first circumferential groove 61 in the radial direction Dr. In the example, only a portion of the second circumferential groove 62 overlaps the first circumferential groove 61 in the radial direction Dr.

The number of the multiple circumferential grooves arranged in the radial direction Dr is not limited to five; it is sufficient for the number of the multiple circumferential grooves to be not less than two. The spacing between the multiple circumferential grooves arranged in the radial direction Dr may not be uniform.

In the example, multiple circumferential grooves are discontinuously provided on the same circumference in each circumference. More specifically, two circumferential grooves 60a are discontinuously provided on the same circumference. The length in the circumferential direction Dc is the same for each circumferential groove 60a located on the same circumference. Five circumferential grooves 60b are discontinuously provided on the same circumference. The length in the circumferential direction Dc is the same for each circumferential groove 60b located on the same circumference. Also, five circumferential grooves 60c are discontinuously provided on the same circumference. The length in the circumferential direction Dc is the same for each circumferential groove 60c located on the same circumference. Five circumferential grooves 60d are discontinuously provided on the same circumference. The length in the circumferential direction Dc is the same for each circumferential groove 60d located on the same circumference. Five circumferential grooves 60e are discontinuously provided on the same circumference. The length in the circumferential direction Dc is the same for each circumferential groove 60e located on the same circumference. It is favorable for the number of circumferential grooves provided on the same circumference to be, for example, not less than two.

In the example, the radial-direction groove portion 70 includes multiple radial-direction grooves 70a to 70j that are arranged in the circumferential direction Dc. The radial-direction grooves 70a to 70j are arranged clockwise in the circumferential direction Dc in the order of the radial-direction groove 70a, the radial-direction groove 70b, the radial-direction groove 70c, the radial-direction groove 70d, the radial-direction groove 70e, the radial-direction groove 70f, the radial-direction groove 70g, the radial-direction groove 70h, the radial-direction groove 70i, and the radial-direction groove 70j. The radial-direction grooves 70a to 70j are arranged at uniform spacing in the circumferential direction Dc. One of the radial-direction grooves 70a to 70j that intersects the first circumferential groove 61 is taken as a first radial-direction groove 71; and one of the radial-direction grooves 70a to 70j that intersects the second circumferential groove 62 is taken as a second radial-direction groove 72. The intersection between the first radial-direction groove 71 and the first circumferential groove 61 is taken as an intersection P1; and the intersection between the second radial-direction groove 72 and the second circumferential groove 62 is taken as an intersection P2. For example, the first radial-direction groove 71 and the second radial-direction groove 72 are next to each other in the circumferential direction Dc. In the example, the radial-direction groove 70a is the first radial-direction groove 71; and the radial-direction groove 70j is the second radial-direction groove 72.

It is favorable for at least a portion of the second radial-direction groove 72 to overlap the first radial-direction groove 71 in the circumferential direction Dc. In the example, all of the radial-direction grooves 70a to 70j extend from the circumferential groove 60a to the circumferential groove 60e. That is, in the example, the entire second radial-direction groove 72 overlaps the first radial-direction groove 71 in the circumferential direction Dc.

The number of multiple radial-direction grooves arranged in the circumferential direction Dc is not limited to ten; it is sufficient for the number of multiple radial-direction grooves to be not less than two. For example, the number of multiple radial-direction grooves arranged in the circumferential direction Dc is equal to the total of the number of the first circumferential grooves 61 located on the same circumference and the number of the second circumferential grooves 62 located on the same circumference. The spacing between the multiple radial-direction grooves arranged in the circumferential direction Dc may not be uniform.

As illustrated in FIG. 3, the first circumferential groove 61 includes a first end portion 61a and a second end portion 61b. The first end portion 61a is positioned at one end side of the first circumferential groove 61 in the circumferential direction Dc. The second end portion 61b is positioned at the other end side of the first circumferential groove 61 in the circumferential direction Dc. The second circumferential groove 62 includes a third end portion 62a and a fourth end portion 62b. The third end portion 62a is positioned at one end side of the second circumferential groove 62 in the circumferential direction Dc. The fourth end portion 62b is positioned at the other end side of the second circumferential groove 62 in the circumferential direction Dc. In the example, the end portion in the clockwise direction is called the one end side, and the end portion in the counterclockwise direction is called the other end side; however, the one end side and the other end side may be reversed.

The third end portion 62a of the second circumferential groove does not overlap the first end portion 61a of the first circumferential groove 61 in the radial direction Dr. That is, an imaginary straight line IL3 that connects the third end portion 62a and the center CT intersects an imaginary straight line IL1 that connects the first end portion 61a and the center CT. The fourth end portion 62b of the second circumferential groove 62 does not overlap the first end portion 61a of the first circumferential groove 61 in the radial direction Dr. That is, an imaginary straight line IL4 that connects the fourth end portion 62b and the center CT intersects the imaginary straight line IL1.

Because the third and fourth end portions 62a and 62b of the second circumferential groove 62 do not overlap the first end portion 61a of the first circumferential groove 61 in the radial direction Dr, the alignment of the end portion of the first circumferential groove 61 and the end portion of the second circumferential groove 62 in a straight line in the radial direction Dr can be suppressed. The occurrence of regions to which the cooling gas does not easily spread can be suppressed thereby, and the uniformity of the cooling gas distribution in the circumferential direction Dc can be increased.

The structure of the ceramic dielectric substrate 10 of recent years is made more complex to increase the patterning precision; and there are cases where multiple cooling gas holes 14 cannot be located on the same circumference. For example, when the heater 30 is included inside the ceramic dielectric substrate 10, there are cases where the multiple cooling gas holes 14 can no longer be located on the same circumference because the multiple cooling gas holes 14 are arranged to avoid the heater 30. When the multiple cooling gas holes 14 are not located on the same circumference, there is a risk that the uniformity of the cooling gas distribution in the circumferential direction Dc may decrease according to the shape of the groove pattern. Conversely, according to the electrostatic chuck 100, the uniformity of the cooling gas distribution in the circumferential direction Dc can be increased even when the multiple cooling gas holes 14 are not located on the same circumference. For example, in the electrostatic chuck 100 that includes the heater 30 as well, the uniformity of the cooling gas distribution in the circumferential direction Dc can be increased.

In the example, the third end portion 62a of the second circumferential groove 62 does not overlap the second end portion 61b of the first circumferential groove 61 in the radial direction Dr. That is, in the example, the imaginary straight line IL3 intersects an imaginary straight line IL2 that connects the second end portion 61b and the center CT. Also, in the example, the fourth end portion 62b of the second circumferential groove 62 does not overlap the second end portion 61b of the first circumferential groove 61 in the radial direction Dr. That is, in the example, the imaginary straight line IL4 intersects the imaginary straight line IL2.

Because the third and fourth end portions 62a and 62b of the second circumferential groove 62 do not overlap the second end portion 61b of the first circumferential groove 61 in the radial direction Dr, the alignment of the end portion of the first circumferential groove 61 and the end portion of the second circumferential groove 62 in a straight line in the radial direction Dr can be suppressed. The occurrence of regions to which the cooling gas does not easily spread can be further suppressed thereby, and the uniformity of the cooling gas distribution in the circumferential direction Dc can be further improved.

The third end portion 62a may overlap the second end portion 61b in the radial direction Dr. That is, the imaginary straight line IL3 may be positioned on the same straight line as the imaginary straight line IL2. Also, the fourth end portion 62b may overlap the second end portion 61b in the radial direction Dr. That is, the imaginary straight line IL4 may be positioned on the same straight line as the imaginary straight line IL2.

In the example, the multiple cooling gas holes 14 are located at positions that overlap the radial-direction grooves 70a to 70j when viewed in plan. The multiple cooling gas holes 14 include a first hole 14a that overlaps the first radial-direction groove 71 when viewed in plan, and a second hole 14b that overlaps the second radial-direction groove 72 when viewed in plan. The first hole 14a communicates with the first radial-direction groove 71. The second hole 14b communicates with the second radial-direction groove 72. In the example, the multiple cooling gas holes 14 including the first and second holes 14a and 14b are located on the same circumference having the center CT as the center.

The first hole 14a and the second hole 14b are connected to one gas inlet path 23. That is, the first hole 14a and the second hole 14b are connected to the same gas inlet path 23. In other words, the first hole 14a and the second hole 14b are connected to one gas supplier 24. In other words, the first hole 14a and the second hole 14b are controlled by one gas supplier 24. For example, the pressure of the cooling gas supplied to the first hole 14a is equal to the pressure of the cooling gas supplied to the second hole 14b. In the example, all of the cooling gas holes 14 including the first and second holes 14a and 14b are connected to one gas supplier 24.

A distance D1 to the first hole 14a from the intersection P1 between the first radial-direction groove 71 and the first circumferential groove 61 is equal to a distance D2 to the second hole 14b from the intersection P2 between the second radial-direction groove 72 and the second circumferential groove 62. By setting the distance D1 to be equal to the distance D2, the uniformity of the cooling gas distribution in the circumferential direction Dc can be increased even when the first hole 14a and the second hole 14b are not located on the same circumference.

The distance D1 and the distance D2 may be different from each other. The distance D1 and the distance D2 each may be 0. That is, the first hole 14a may be located at a position that overlaps the intersection P1; and the second hole 14b may be located at a position that overlaps the intersection P2. Such examples are described in FIGS. 8 and 9.

At least a portion of the second circumferential groove 62 overlaps the first circumferential groove 61 in the radial direction Dr. That is, at least one of the third end portion 62a or the fourth end portion 62b of the second circumferential groove 62 overlaps the first circumferential groove 61 in the radial direction Dr. In the example, the third end portion 62a of the second circumferential groove 62 overlaps the first circumferential groove 61 in the radial direction Dr; and the fourth end portion 62b of the second circumferential groove 62 does not overlap the first circumferential groove 61 in the radial direction Dr. That is, a portion of the second circumferential groove 62 overlaps the first circumferential groove 61 in the radial direction Dr; and another portion of the second circumferential groove 62 does not overlap the first circumferential groove 61 in the radial direction Dr. In other words, the second circumferential groove 62 is shifted from the first circumferential groove 61 in the radial direction Dr.

The first circumferential groove 61 includes a central region 61c, a first end region 61d, and a second end region 61e. The first end region 61d is a region that is positioned at the one end side of the circumferential direction Dc and includes the first end portion 61a. The second end region 61e is a region that is positioned at the other end side of the circumferential direction Dc and includes the second end portion 61b. The central region 61c is a region that is positioned between the first end region 61d and the second end region 61e in the circumferential direction Dc. The central region 61c includes the circumferential direction Dc center of the first circumferential groove 61. In FIG. 3, a centerline CL that extends in the radial direction Dr through the circumferential direction Dc center of the first circumferential groove 61 is illustrated by a single dot-dash line. In the example, the circumferential direction Dc center of the first circumferential groove 61 is aligned with the intersection P1. For example, when the first circumferential groove 61 is uniformly divided into three regions in the circumferential direction Dc, the region that is positioned furthest at the one end side can be considered to be the first end region 61d; the region that is positioned furthest at the other end side can be considered to be the second end region 61e; and the region that is positioned at the center can be considered to be the central region 61c.

For example, the third end portion 62a of the second circumferential groove 62 overlaps the central region 61c of the first circumferential groove 61 in the radial direction Dr. Because the third end portion 62a of the second circumferential groove 62 overlaps the central region 61c of the first circumferential groove 61 in the radial direction Dr, the uniformity of the cooling gas distribution in the circumferential direction Dc can be further improved.

In such a case, it is favorable for the third end portion 62a of the second circumferential groove 62 to be positioned closer to the other end side of the first circumferential groove 61 (the second end portion 61b) in the circumferential direction Dc than to the one end side of the first circumferential groove 61 (the first end portion 61a) in the circumferential direction Dc center (the centerline CL) of the first circumferential groove 61. That is, it is favorable for the second circumferential groove 62 not to overlap the centerline CL when viewed in plan. By positioning the third end portion 62a of the second circumferential groove 62 further toward the other end side of the circumferential direction Dc than the circumferential direction Dc center (the centerline CL) of the first circumferential groove 61, the uniformity of the cooling gas distribution in the circumferential direction Dc can be further improved.

In such a case, it is favorable for the fourth end portion 62b of the second circumferential groove 62 to be positioned further toward the other end side of the circumferential direction Dc than the second end portion 61b of the first circumferential groove 61. That is, it is favorable for the fourth end portion 62b of the second circumferential groove 62 not to overlap the first circumferential groove 61 in the radial direction Dr. By positioning the fourth end portion 62b of the second circumferential groove 62 further toward the other end side of the circumferential direction Dc than the second end portion 61b of the first circumferential groove 61, the uniformity of the cooling gas distribution in the circumferential direction Dc can be further improved.

The third end portion 62a of the second circumferential groove 62 may overlap the first end region 61d of the first circumferential groove 61 or may overlap the second end region 61e of the first circumferential groove 61 in the radial direction Dr. The third end portion 62a of the second circumferential groove 62 may be positioned closer to the one end side of the circumferential direction Dc than the circumferential direction Dc center (the centerline CL) of the first circumferential groove 61. That is, the second circumferential groove 62 may overlap the centerline CL when viewed in plan. The fourth end portion 62b of the second circumferential groove 62 may be positioned closer to the one end side of the circumferential direction Dc than the second end portion 61b of the first circumferential groove 61. That is, the fourth end portion 62b of the second circumferential groove 62 may overlap the first circumferential groove 61 in the radial direction Dr.

In the example, the end portion of the circumferential groove 60d at the one end side of the circumferential direction Dc overlaps, in the radial direction Dr, the end portion (the first end portion 61a) of the circumferential groove 60b (the first circumferential groove 61) at the one end side of the circumferential direction Dc. Also, the end portion of the circumferential groove 60d at the other end side of the circumferential direction Dc overlaps, in the radial direction Dr, the end portion (the second end portion 61b) of the circumferential groove 60b (the first circumferential groove 61) at the other end side of the circumferential direction Dc. Thus, when another circumferential groove is located between two circumferential grooves (i.e., when two circumferential grooves are not next to each other), the end portions of the two circumferential grooves may overlap in the radial direction Dr.

Figure 4:
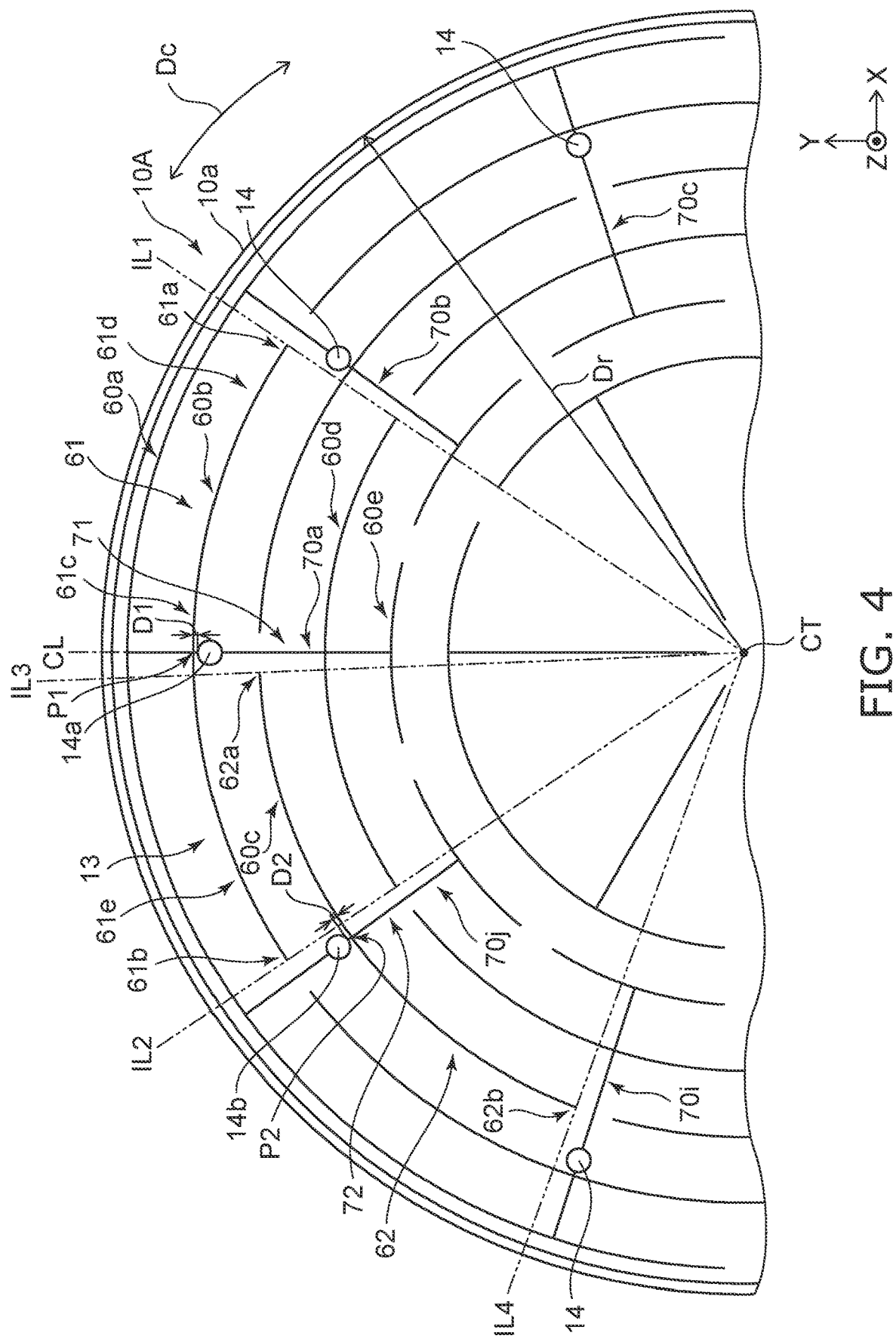
FIG. 4 is a plan view schematically illustrating a portion of a ceramic dielectric substrate according to a modification of the first embodiment.

FIG. 4 is a plan view schematically illustrating a portion of a ceramic dielectric substrate according to a modification of the first embodiment.

FIG. 4 is a plan view of the ceramic dielectric substrate 10A when viewed from the first major surface 11 side.

FIG. 4 is an enlarged view of a region corresponding to region R1 shown in FIG. 2.

In the example as illustrated in FIG. 4, the first hole 14a and the second hole 14b are not located on the same circumference. Otherwise, the ceramic dielectric substrate 10A is the same as the ceramic dielectric substrate 10 according to the first embodiment shown in FIGS. 2 and 3.

In the example as well, because the third and fourth end portions 62a and 62b of the second circumferential groove 62 do not overlap the first and second end portions 61a and 61b of the first circumferential groove 61 in the radial direction Dr, the uniformity of the cooling gas distribution in the circumferential direction Dc can be increased.

In the example as well, the distance D1 to the first hole 14a from the intersection P1 between the first radial-direction groove 71 and the first circumferential groove 61 is equal to the distance D2 to the second hole 14b from the intersection P2 between the second radial-direction groove 72 and the second circumferential groove 62. By setting the distance D1 to be equal to the distance D2, the uniformity of the cooling gas distribution in the circumferential direction Dc can be increased even when the first hole 14a and the second hole 14b are not located on the same circumference.

Figure 5:
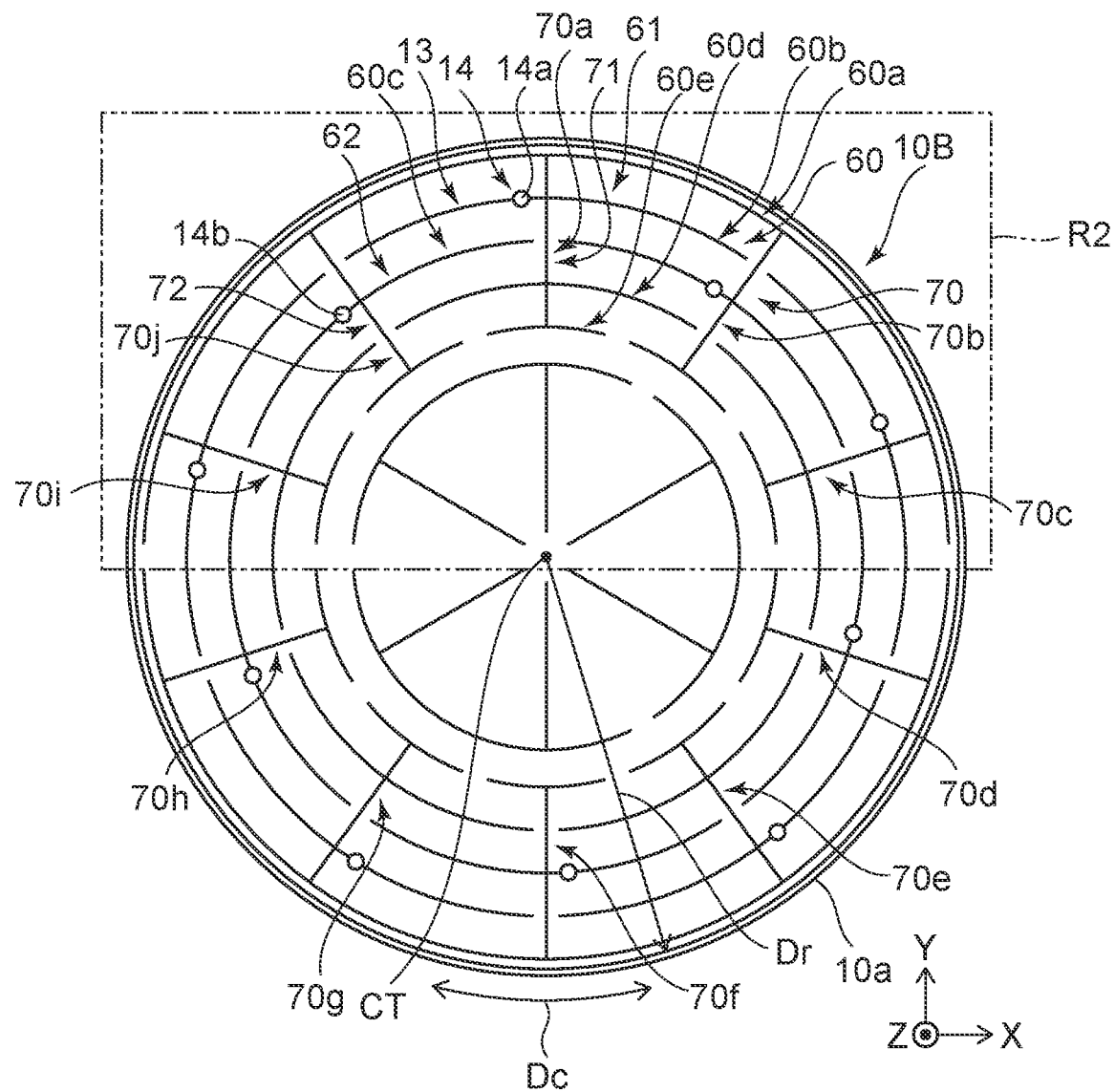
FIG. 5 is a plan view schematically illustrating a ceramic dielectric substrate according to a second embodiment.

FIG. 5 is a plan view schematically illustrating a ceramic dielectric substrate according to a second embodiment.

Figure 6:
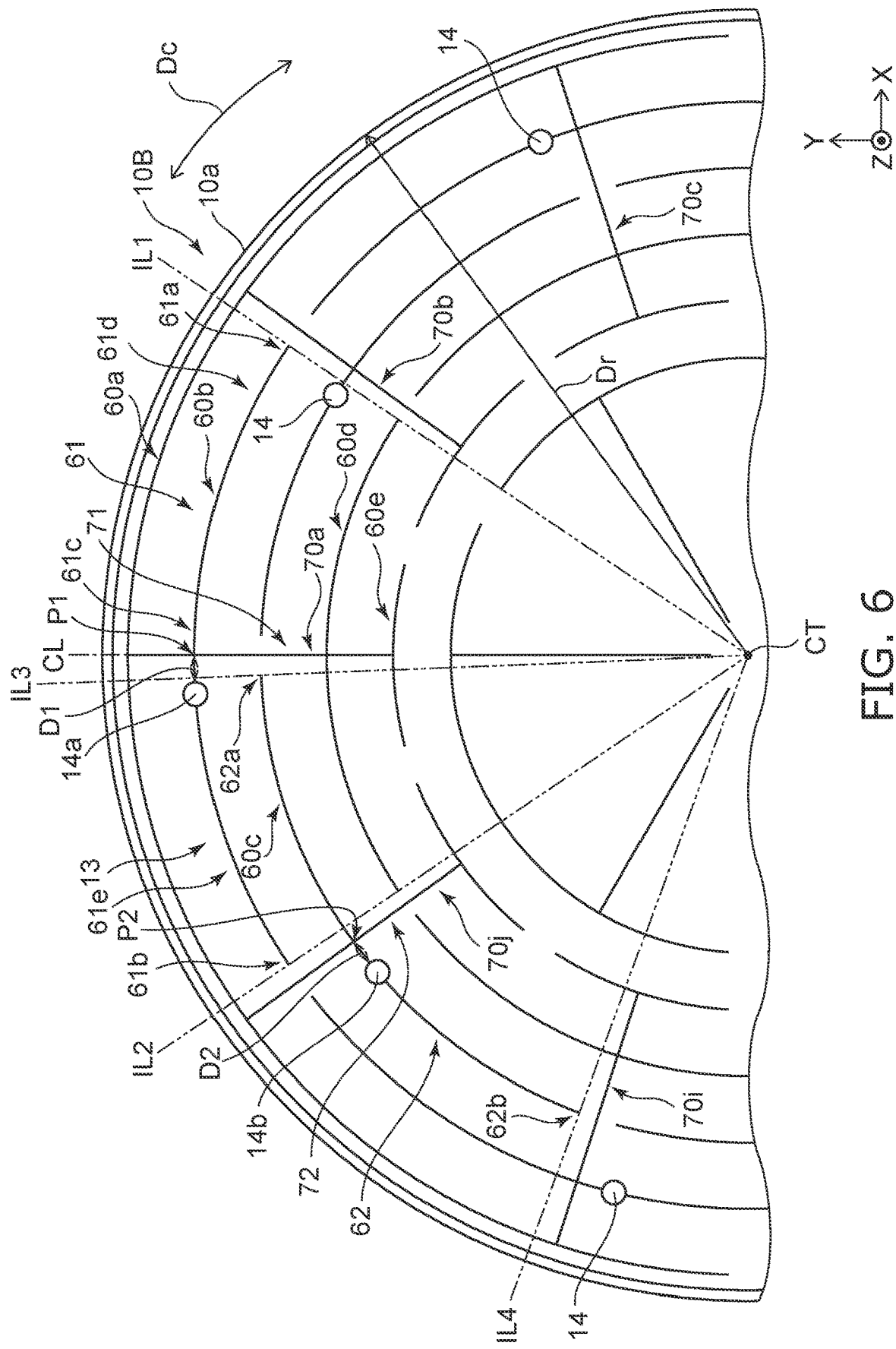
FIG. 6 is a plan view schematically illustrating a portion of the ceramic dielectric substrate according to the second embodiment.

FIG. 6 is a plan view schematically illustrating a portion of the ceramic dielectric substrate according to the second embodiment.

FIGS. 5 and 6 are plan views of the ceramic dielectric substrate 10B when viewed from the first major surface 11 side.

FIG. 5 is an enlarged view of region R2 shown in FIG. 6.

In the example as illustrated in FIGS. 5 and 6, the multiple cooling gas holes 14 are located at positions that overlap the circumferential grooves 60a and 60b when viewed in plan. The multiple cooling gas holes 14 include the first hole 14a that overlaps the first circumferential groove 61 when viewed in plan, and the second hole 14b that overlaps the second circumferential groove 62 when viewed in plan. The first hole 14a communicates with the first circumferential groove 61. The second hole 14b communicates with the second circumferential groove 62. Otherwise, the ceramic dielectric substrate 10B is the same as the ceramic dielectric substrate 10 according to the first embodiment shown in FIGS. 2 and 3.

In the example as well, the third end portion 62a of the second circumferential groove 62 does not overlap the first end portion 61a of the first circumferential groove 61 in the radial direction Dr. Also, the fourth end portion 62b of the second circumferential groove 62 does not overlap the first end portion 61a of the first circumferential groove 61 in the radial direction Dr. The third end portion 62a of the second circumferential groove 62 does not overlap the second end portion 61b of the first circumferential groove 61 in the radial direction Dr. The fourth end portion 62b of the second circumferential groove 62 does not overlap the second end portion 61b of the first circumferential groove 61 in the radial direction Dr.

Because the third and fourth end portions 62a and 62b of the second circumferential groove 62 do not overlap the first and second end portions 61a and 61b of the first circumferential groove 61 in the radial direction Dr, the alignment of the end portion of the first circumferential groove 61 and the end portion of the second circumferential groove 62 in a straight line in the radial direction Dr can be suppressed. The occurrence of regions to which the cooling gas does not easily spread can be suppressed thereby, and the uniformity of the cooling gas distribution in the circumferential direction Dc can be increased. Also, the uniformity of the cooling gas distribution in the circumferential direction Dc can be increased even when the cooling gas holes 14 are not located on the same circumference.

In the example as well, the distance D1 to the first hole 14a from the intersection P1 between the first radial-direction groove 71 and the first circumferential groove 61 is equal to the distance D2 to the second hole 14b from the intersection P2 between the second radial-direction groove 72 and the second circumferential groove 62. By setting the distance D1 to be equal to the distance D2, the uniformity of the cooling gas distribution in the circumferential direction Dc can be increased even when the first hole 14a and the second hole 14b are not located on the same circumference.

Figure 7:
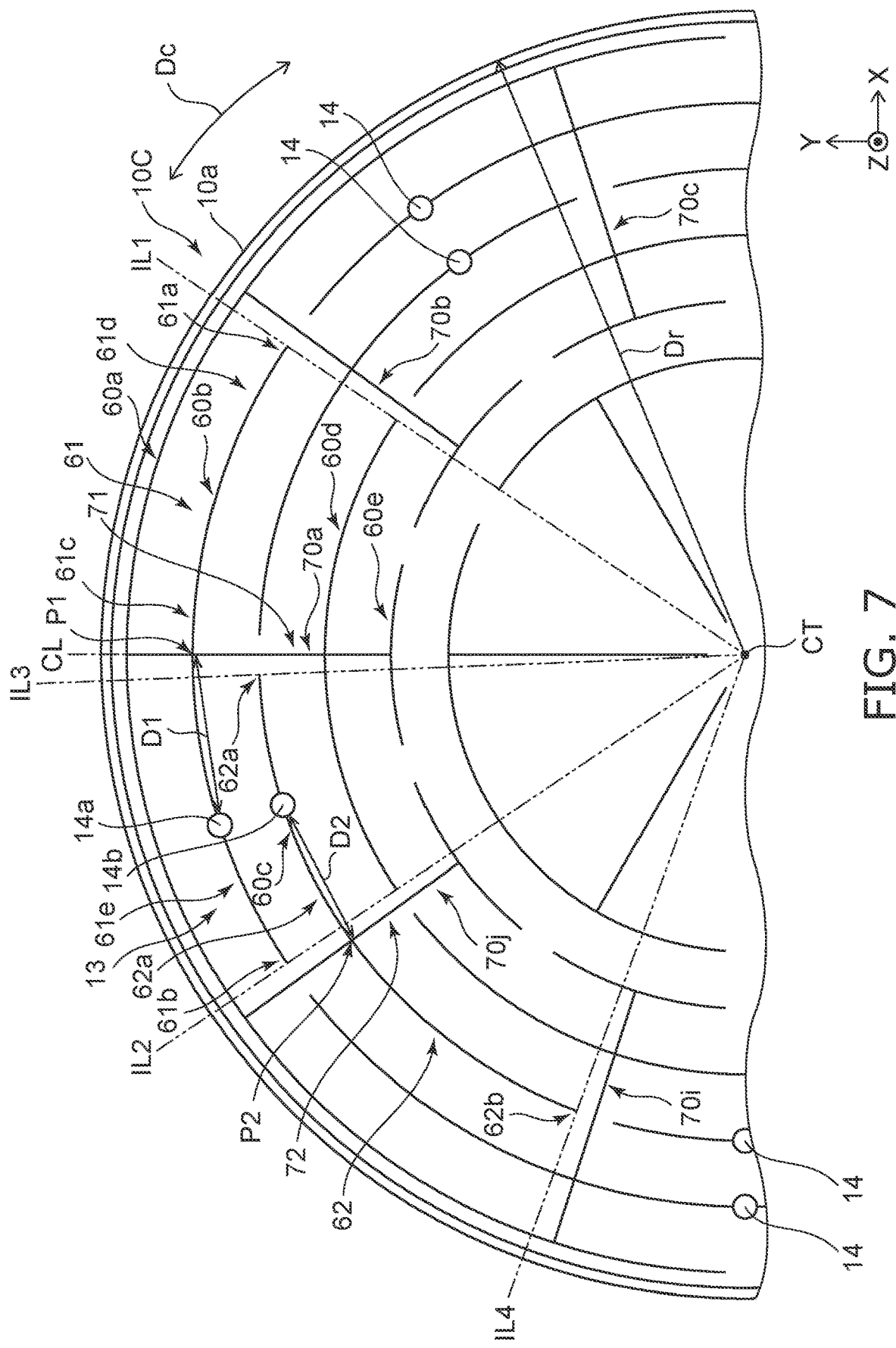
FIG. 7 is a plan view schematically illustrating a portion of a ceramic dielectric substrate according to a modification of the second embodiment.

FIG. 7 is a plan view schematically illustrating a portion of a ceramic dielectric substrate according to a modification of the second embodiment.

FIG. 7 is a plan view of the ceramic dielectric substrate 10C when viewed from the first major surface 11 side.

FIG. 7 is an enlarged view of a region corresponding to region R2 shown in FIG. 5.

In the example as illustrated in FIG. 7, the first hole 14a and the second hole 14b are located at positions that overlap in the radial direction Dr. Otherwise, the ceramic dielectric substrate 10C is the same as the ceramic dielectric substrate 10B according to the second embodiment shown in FIGS. 5 and 6.

In the example as well, because the third and fourth end portions 62a and 62b of the second circumferential groove 62 do not overlap the first and second end portions 61a and 61b of the first circumferential groove 61 in the radial direction Dr, the uniformity of the cooling gas distribution in the circumferential direction Dc can be increased.

In the example as well, the distance D1 to the first hole 14a from the intersection P1 between the first radial-direction groove 71 and the first circumferential groove 61 is equal to the distance D2 to the second hole 14b from the intersection P2 between the second radial-direction groove 72 and the second circumferential groove 62. By setting the distance D1 to be equal to the distance D2, the uniformity of the cooling gas distribution in the circumferential direction Dc can be increased even when the first hole 14a and the second hole 14b are located at positions that overlap in the radial direction Dr.

Figure 8:
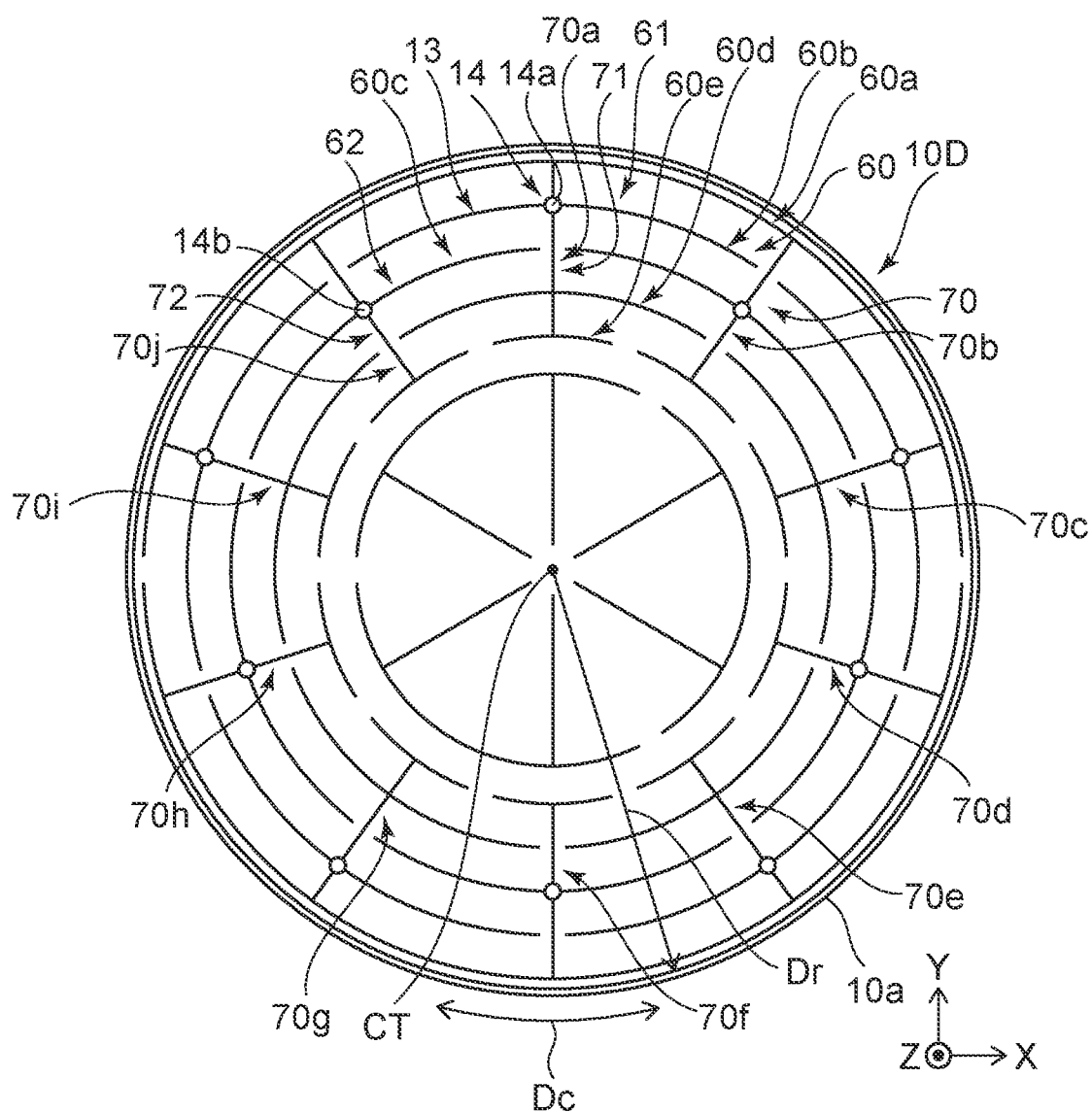
FIG. 8 is a plan view schematically illustrating a ceramic dielectric substrate according to a third embodiment.

FIG. 8 is a plan view schematically illustrating a ceramic dielectric substrate according to a third embodiment.

FIG. 8 is a plan view of the ceramic dielectric substrate 10D when viewed from the first major surface 11 side.

In the example as illustrated in FIG. 8, the first hole 14a is located at a position that overlaps the intersection P1. The second hole 14b is located at a position that overlaps the intersection P2. Otherwise, the ceramic dielectric substrate 10D is the same as the ceramic dielectric substrate 10 according to the first embodiment shown in FIGS. 2 and 3.

In the example as well, because the third and fourth end portions 62a and 62b of the second circumferential groove 62 do not overlap the first and second end portions 61a and 61b of the first circumferential groove 61 in the radial direction Dr, the uniformity of the cooling gas distribution in the circumferential direction Dc can be increased.

Thus, the cooling gas holes 14 may be located at positions that overlap the circumferential grooves (the first circumferential groove 61 and/or the second circumferential groove 62), may be located at positions that overlap the radial-direction grooves (the first radial-direction groove 71 and/or the second radial-direction groove 72), and may be located at positions that overlap the intersections (intersection P1 and/or the intersection P2) between the circumferential grooves and the radial-direction grooves.

Figure 9:
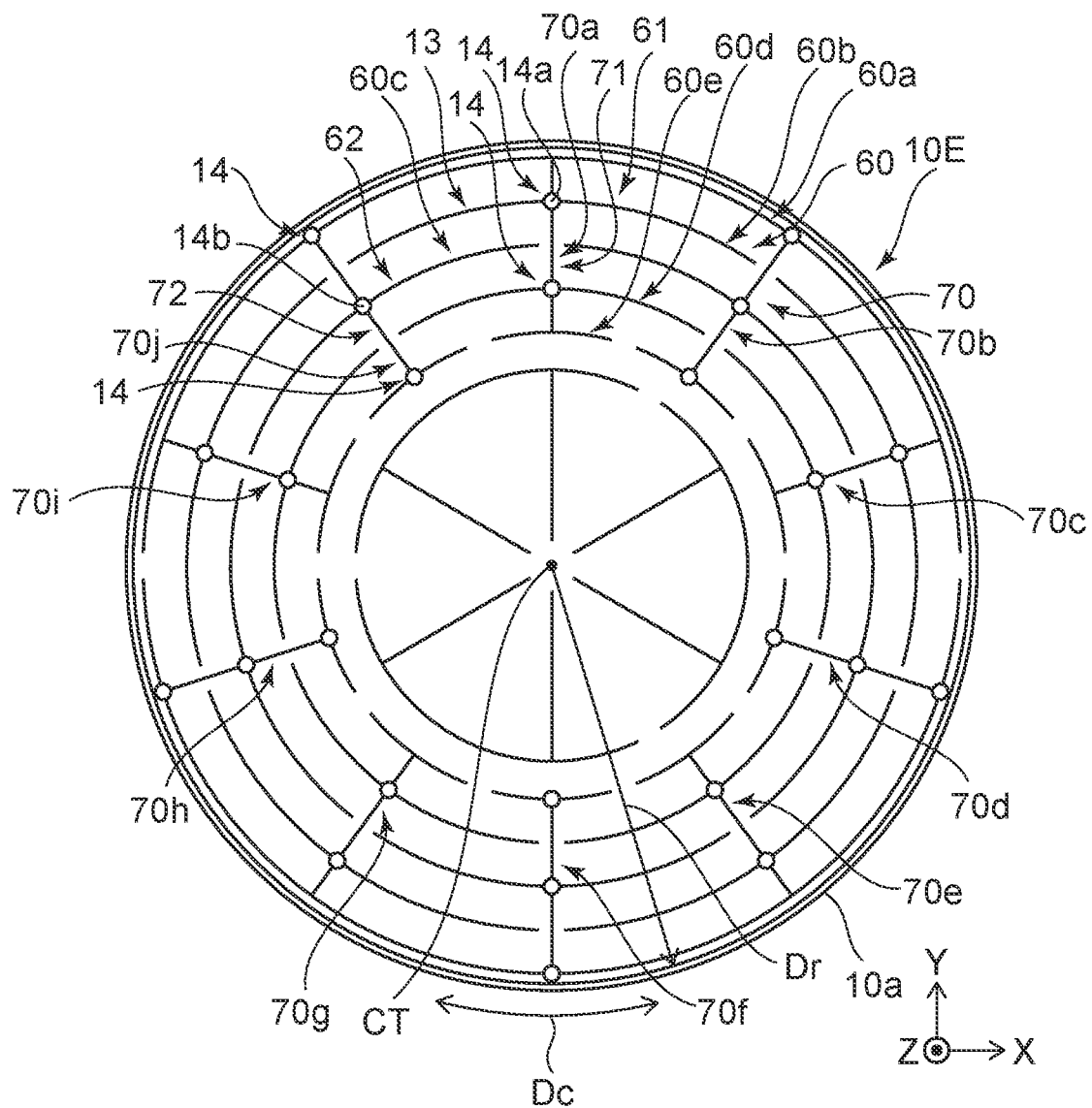
FIG. 9 is a plan view schematically illustrating a ceramic dielectric substrate according to a modification of the third embodiment.

FIG. 9 is a plan view schematically illustrating a ceramic dielectric substrate according to a modification of the third embodiment.

FIG. 9 is a plan view of the ceramic dielectric substrate 10E when viewed from the first major surface 11 side.

In the example as illustrated in FIG. 9, the cooling gas holes 14 are located also at positions that overlap a portion of the other intersections between the circumferential grooves and the radial-direction grooves in addition to the cooling gas holes 14 provided in the ceramic dielectric substrate 10D according to the third embodiment shown in FIG. 8. The cooling gas holes 14 that are located at positions that overlap such other intersections are provided as necessary and are omissible.

In the example as well, because the third and fourth end portions 62a and 62b of the second circumferential groove 62 do not overlap the first and second end portions 61a and 61b of the first circumferential groove 61 in the radial direction Dr, the uniformity of the cooling gas distribution in the circumferential direction Dc can be increased.

Figure 10:
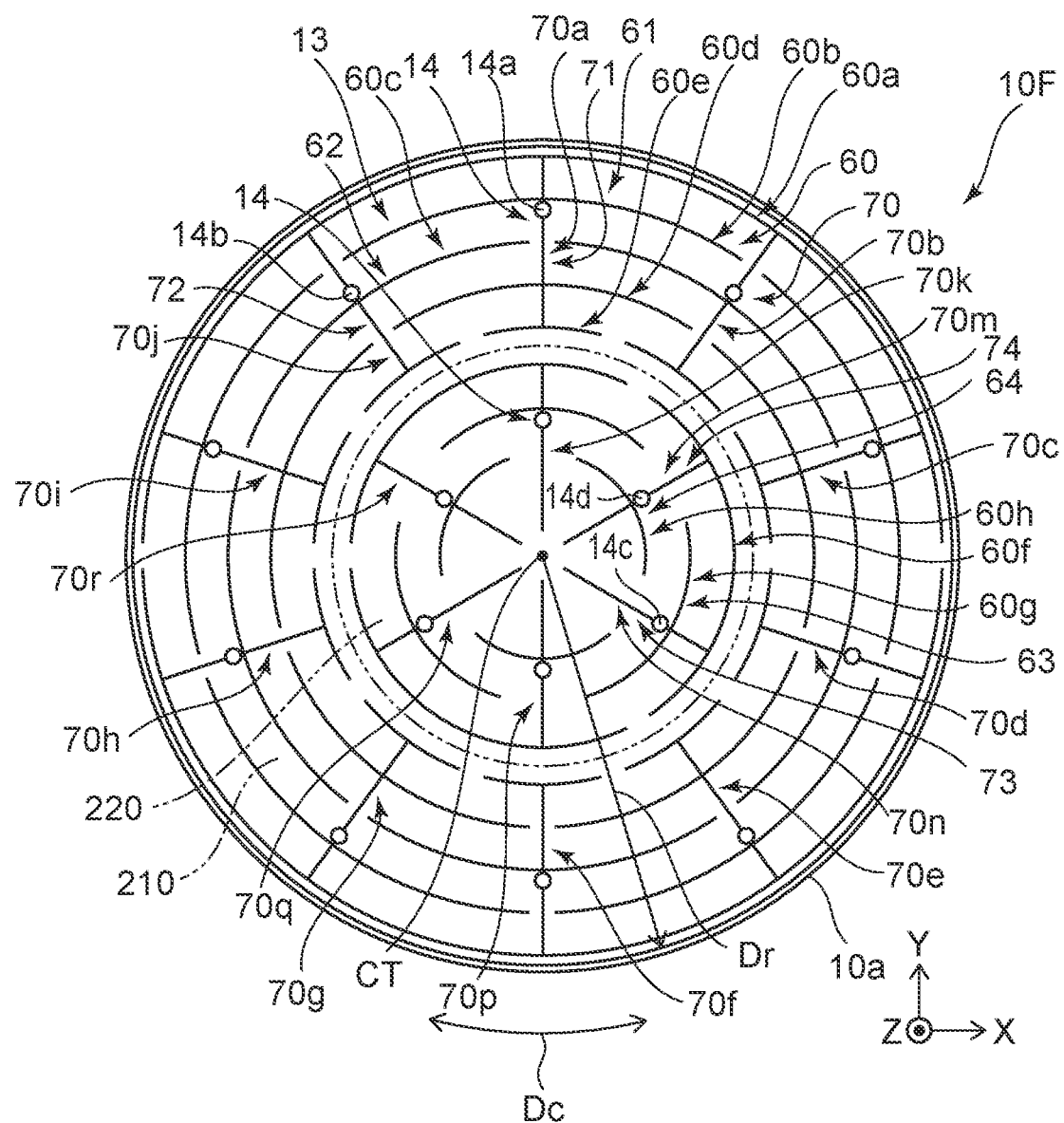
FIG. 10 is a plan view schematically illustrating a ceramic dielectric substrate according to a fourth embodiment.
Figure 11:
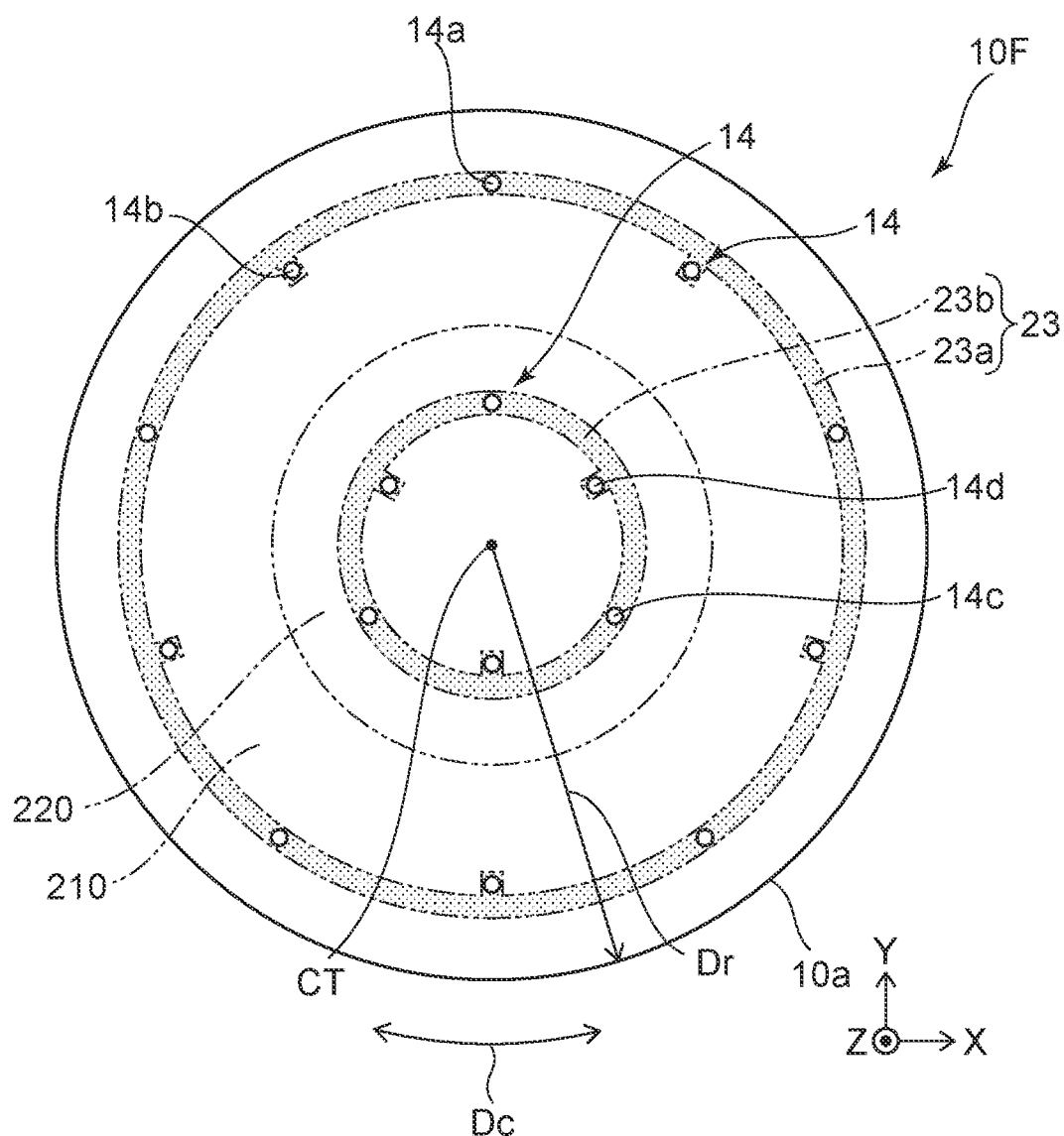
FIG. 11 is a plan view schematically illustrating a ceramic dielectric substrate according to a fourth embodiment.

FIGS. 10 and 11 are plan views schematically illustrating a ceramic dielectric substrate according to a fourth embodiment.

FIGS. 10 and 11 are plan views of the ceramic dielectric substrate 10F when viewed from the first major surface 11 side.

In the example as illustrated in FIGS. 10 and 11, the ceramic dielectric substrate 10F includes a first zone 210 and a second zone 220. Otherwise, the ceramic dielectric substrate 10F is the same as the ceramic dielectric substrate 10A according to the modification of the first embodiment shown in FIG. 4.

In the example, the first zone 210 and the second zone 220 are arranged in the radial direction Dr. The second zone 220 is positioned inward of the first zone 210 in the radial direction Dr. In the example, the first zone 210 is outside the double dot-dash line; and the second zone 220 is inside the double dot-dash line. The first zone 210 includes, for example, the outer edge 10a. The second zone 220 includes, for example, the center CT.

As illustrated in FIG. 10, the first zone 210 and the second zone 220 each include the groove part 13 (the circumferential groove portion 60 and the radial-direction groove portion 70) and the multiple cooling gas holes 14. The groove part 13 of the first zone 210 and the groove part 13 of the second zone 220 do not communicate with each other.

The first zone 210 includes the first hole 14a that overlaps the first radial-direction groove 71 when viewed in plan, and the second hole 14b that overlaps the second radial-direction groove 72 when viewed in plan. In the example, the first hole 14a and the second hole 14b are not located on the same circumference. The first hole 14a and the second hole 14b may be located on the same circumference. The first hole 14a and the second hole 14b may be located at positions that overlap the circumferential groove portion 60 when viewed in plan, and may be located at positions that overlap the intersections between the circumferential groove portion 60 and the radial-direction groove portion 70.

In the example, the circumferential groove portion 60 includes circumferential grooves 60f to 60h that are located in the second zone 220 in addition to the circumferential grooves 60a to 60e that are located in the first zone 210. The circumferential grooves 60f to 60h are arranged from the outer circumference side toward the center CT in the radial direction Dr in the order of the circumferential grooves 60f, 60g, and 60h. The circumferential grooves 60f to 60h are located on circumferences of concentric circles that have different radii and have the center CT as the center. The circumferential grooves 60f to 60h are arranged at uniform spacing in the radial direction Dr. Two of these circumferential grooves 60f to 60h that are next to each other in the radial direction Dr are taken as a third circumferential groove 63 and a fourth circumferential groove 64.

The third and fourth circumferential grooves 63 and 64 of the second zone 220 correspond to the first and second circumferential grooves 61 and 62 of the first zone 210. For example, the relationship between the first circumferential groove 61 and the second circumferential groove 62 described above also is applied to the relationship between the third circumferential groove 63 and the fourth circumferential groove 64.

In the example, the radial-direction groove portion 70 includes radial-direction grooves 70k to 70r that are located in the second zone 220 in addition to the radial-direction grooves 70a to 70j that are located in the first zone 210. The radial-direction grooves 70k to 70r are arranged clockwise in the circumferential direction Dc in the order of the radial-direction groove 70k, the radial-direction groove 70m, the radial-direction groove 70n, the radial-direction groove 70p, the radial-direction groove 70q, and the radial-direction groove 70r. The radial-direction grooves 70k to 70r are arranged at uniform spacing in the circumferential direction Dc. One of the radial-direction grooves 70k to 70r that intersects the third circumferential groove 63 is taken as a third radial-direction groove 73; and one of the radial-direction grooves 70k to 70r that intersects the fourth circumferential groove 64 is taken as a fourth radial-direction groove 74.

The third and fourth radial-direction grooves 73 and 74 of the second zone 220 correspond to the first and second radial-direction grooves 71 and 72 of the first zone 210. For example, the relationship between the first radial-direction groove 71 and the second radial-direction groove 72 described above also is applied to the relationship between the third radial-direction groove 73 and the fourth radial-direction groove 74.

The second zone 220 includes a third hole 14c that overlaps the third radial-direction groove 73 when viewed in plan, and a fourth hole 14d that overlaps the fourth radial-direction groove 74 when viewed in plan. In the example, the third hole 14c and the fourth hole 14d are not located on the same circumference. The third hole 14c and the fourth hole 14d may be located on the same circumference. The third hole 14c and the fourth hole 14d may be located at positions that overlap the circumferential groove portion 60 when viewed in plan, and may be located at positions that overlap the intersections between the circumferential groove portion 60 and the radial-direction groove portion 70.

In the example as illustrated in FIG. 11, the gas inlet path 23 includes a first gas inlet path 23a and a second gas inlet path 23b. In FIG. 11, the positions of the first gas inlet path 23a and the second gas inlet path 23b when viewed in plan are illustrated by double dot-dash lines.

The first gas inlet path 23a is located in the first zone 210 and is connected to the cooling gas holes 14 located in the first zone 210. The first hole 14a and the second hole 14b are connected to the first gas inlet path 23a.

The second gas inlet path 23b is located in the second zone 220 and is connected to the cooling gas holes 14 located in the second zone 220. The third hole 14c and the fourth hole 14d are connected to the second gas inlet path 23b.

The first gas inlet path 23a and the second gas inlet path 23b each are substantially ring-shaped when viewed in plan. For example, the second gas inlet path 23b is positioned inward of the first gas inlet path 23a in the radial direction Dr when viewed in plan.

For example, the first gas inlet path 23a and the second gas inlet path 23b are connected to different gas suppliers 24. That is, for example, the gas supplier 24 that supplies the cooling gas to the third and fourth holes 14c and 14d is different from the gas supplier 24 that supplies the cooling gas to the first and second holes 14a and 14b. For example, the cooling gas holes 14 (the third hole 14c and the fourth hole 14d) that are located in the second zone 220 are controlled by a different gas supplier 24 from that of the cooling gas holes 14 (the first hole 14a and the second hole 14b) that are located in the first zone 210. Thereby, for example, the cooling gas holes 14 (the first hole 14a and the second hole 14b) that are located in the first zone 210 and the cooling gas holes 14 (the third hole 14c and the fourth hole 14d) that are located in the second zone 220 can be separately controlled. For example, the pressure of the cooling gas supplied to the third and fourth holes 14c and 14d may be equal to or different from the pressure of the cooling gas supplied to the first and second holes 14a and 14b.

In the example as well, because the third and fourth end portions 62a and 62b of the second circumferential groove 62 do not overlap the first and second end portions 61a and 61b of the first circumferential groove 61 in the radial direction Dr in the first zone 210, the uniformity of the cooling gas distribution in the circumferential direction Dc can be increased. Because the third and fourth end portions 62a and 62b of the fourth circumferential groove 64 do not overlap the first and second end portions 61a and 61b of the third circumferential groove 63 in the radial direction Dr in the second zone 220, the uniformity of the cooling gas distribution in the circumferential direction Dc can be increased.

The uniformity of the cooling gas distribution in the plane can be further improved because the cooling gas holes 14 (the first hole 14a and the second hole 14b) that are located in the first zone 210 and the cooling gas holes 14 (the third hole 14c and the fourth hole 14d) that are located in the second zone 220 can be separately controlled.

Figure 12:
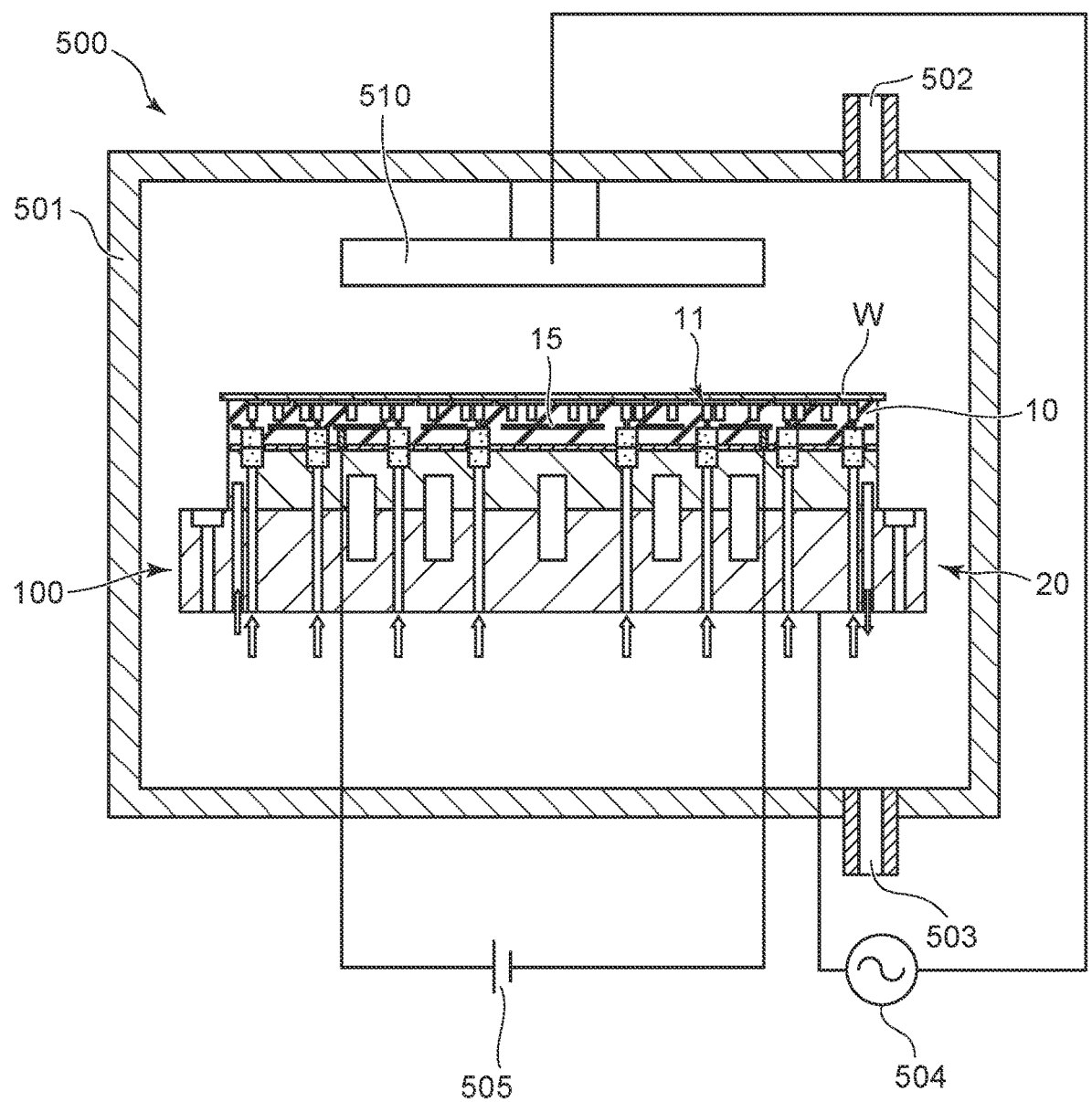
FIG. 12 is a cross-sectional view schematically illustrating a wafer processing apparatus that includes the electrostatic chuck according to embodiments.

FIG. 12 is a cross-sectional view schematically illustrating a wafer processing apparatus that includes the electrostatic chuck according to embodiments.

As illustrated in FIG. 12, the wafer processing apparatus 500 includes a processing container 501, a high frequency power supply 504, the clamping power supply 505, an upper electrode 510, and the electrostatic chuck 100. The upper electrode 510 and a processing gas inlet 502 for introducing a processing gas to the interior are provided in the ceiling of the processing container 501. An exhaust port 503 for evacuating the interior is provided in the bottom plate of the processing container 501. The electrostatic chuck 100 is located under the upper electrode 510 inside the processing container 501. The upper electrode 510 and the base plate 20 of the electrostatic chuck 100 are connected with the high frequency power supply 504. The electrode layer 15 of the electrostatic chuck 100 is connected with the clamping power supply 505.

The base plate 20 and the upper electrode 510 are substantially parallel to each other and are separated by a prescribed spacing. The processing object W is placed on the first major surface 11 that is positioned between the base plate 20 and the upper electrode 510.

When a voltage (a high frequency voltage) is applied from the high frequency power supply 504 to the base plate 20 and the upper electrode 510, a high frequency electric discharge is generated and the processing gas that is introduced to the processing container 501 is excited and activated by plasma; and the processing object W is processed.

When a voltage (a clamping voltage) is applied from the clamping power supply 505 to the electrode layer 15, a charge is generated at the first major surface 11 side of the electrode layer 15; and the processing object W is clamped to the electrostatic chuck 100 by an electrostatic force.

FIG. 13 is a cross-sectional view schematically illustrating a wafer processing apparatus that includes the electrostatic chuck according to the first embodiment.

In the example as illustrated in FIG. 13, multiple gas inlet paths 23 are connected to one gas supplier 24. The cooling gas that is supplied from the gas supplier 24 passes through the gas inlet paths 23 and is supplied to the cooling gas holes 14. Thereby, the multiple cooling gas holes 14 are controlled by one gas supplier 24.

FIG. 14 is a cross-sectional view schematically illustrating a wafer processing apparatus that includes the electrostatic chuck according to the modification of the first embodiment.

In the example as illustrated in FIG. 14, the gas inlet path 23 branches inside the base plate 20. The gas inlet path 23 includes multiple first portions 26a (gas outflow paths) that communicate with the cooling gas holes 14, a second portion 26b (a gas transverse path) that extends in the lateral direction and combines the multiple first portions 26a, and a third portion 26c (a gas inflow path) that extends from the second portion 26b to the back surface of the base plate 20.

The third portion 26c is connected to the gas supplier 24. The cooling gas that is supplied from the gas supplier 24 passes through the third portion 26c, the second portion 26b, and the first portions 26a, and is supplied to the cooling gas holes 14. Thereby, the multiple cooling gas holes 14 are controlled by one gas supplier 24.

Thus, according to embodiments, an electrostatic chuck and a semiconductor manufacturing apparatus are provided in which the uniformity of the cooling gas distribution in the circumferential direction can be increased.

The invention has been described with reference to the embodiments. However, the invention is not limited to these embodiments. Any design changes in the above embodiments suitably made by those skilled in the art are also encompassed within the scope of the invention as long as they fall within the spirit of the invention. For example, the shape, the size the material, the disposition and the arrangement or the like of the components included in the electrostatic chuck are not limited to illustrations and can be changed appropriately.

The components included in the embodiments described above can be combined to the extent possible, and these combinations are also encompassed within the scope of the invention as long as they include the features of the invention.

What is claimed is:
1. An electrostatic chuck, comprising:
a ceramic dielectric substrate that is circular when viewed in plan; and
a base plate supporting the ceramic dielectric substrate, the ceramic dielectric substrate including
 a first major surface configured to have a processing object placed thereon,
 a second major surface at a side opposite to the first major surface,
 a groove part recessed from the first major surface toward the second major surface, and
 a plurality of cooling gas holes extending between the groove part and the second major surface and configured to pass cooling gas there through,
the groove part including
 a first circumferential groove extending in a circumferential direction,
 a second circumferential groove extending in the circumferential direction, at least a portion of the second circumferential groove being next to the first circumferential groove in a radial direction,
 a third circumferential groove extending in the circumferential direction, at least a portion of the third circumferential groove being next to the second circumferential groove in a radial direction,
 a first radial-direction groove extending in the radial direction and intersecting the first circumferential groove, and
 a second radial-direction groove extending in the radial direction and intersecting the second circumferential groove,
the plurality of cooling gas holes including a first hole overlapping the first radial-direction groove when viewed in plan, and
a second hole overlapping the second radial-direction groove when viewed in plan,
the base plate including a gas inlet path through which the cooling gas is supplied to the first and second holes,
the first circumferential groove including
a first end portion positioned at one end side thereof in the circumferential direction, and
a second end portion positioned at an other end side thereof in the circumferential direction,
the second circumferential groove including
a third end portion positioned at the one end side thereof in the circumferential direction, and
a fourth end portion positioned at the other end side thereof in the circumferential direction,
the third circumferential groove including
a fifth end portion positioned at the one end side thereof in the circumferential direction, and
a sixth end portion positioned at the other end side thereof in the circumferential direction,
the third end portion and the fourth end portion do not overlap the first end portion in the radial direction,
the fifth end portion and the sixth end portion do not overlap the third end portion in the radial direction.

2. The chuck according to claim 1, wherein
a distance to the first hole from an intersection between the first radial-direction groove and the first circumferential groove is equal to a distance to the second hole from an intersection between the second radial-direction groove and the second circumferential groove.

3. The chuck according to claim 1, wherein
the third end portion and the fourth end portion do not overlap the second end portion in the radial direction.

4. The chuck according to claim 1, wherein
the first circumferential groove includes a central region that includes a center of the first circumferential groove in the circumferential direction, and
the third end portion overlaps the central region in the radial direction.

5. The chuck according to claim 4, wherein
the third end portion is positioned closer to the second end portion in the circumferential direction than to the first end portion in the circumferential direction.

6. The chuck according to claim 5, wherein
the fourth end portion does not overlap the first circumferential groove in the radial direction.

7. The chuck according to claim 1, further comprising:
a heater which heats the ceramic dielectric substrate.

8. A semiconductor manufacturing apparatus, comprising:
the chuck according to claim 1; and
a gas supplier which supplies the cooling gas to the first and second holes via the gas inlet path.

9. An electrostatic chuck, comprising:
a ceramic dielectric substrate that is circular when viewed in plan; and
a base plate supporting the ceramic dielectric substrate,
the ceramic dielectric substrate including
a first major surface configured to have a processing object placed thereon,
a second major surface at a side opposite to the first major surface,
a groove part recessed from the first major surface toward the second major surface, and
a plurality of cooling gas holes extending between the groove part and the second major surface and configured to pass cooling gas there through,
the groove part including
a first circumferential groove extending in a circumferential direction,
a second circumferential groove extending in the circumferential direction, at least a portion of the second circumferential groove being next to the first circumferential groove in a radial direction,
a third circumferential groove extending in the circumferential direction, at least a portion of the third circumferential groove being next to the second circumferential groove in a radial direction,
a first radial-direction groove extending in the radial direction and intersecting the first circumferential groove, and
a second radial-direction groove extending in the radial direction and intersecting the second circumferential groove,
the plurality of cooling gas holes including
a first hole overlapping the first circumferential groove when viewed in plan, and
a second hole overlapping the second circumferential groove when viewed in plan,
the base plate including a gas inlet path through which the cooling gas is supplied to the first and second holes,
the first circumferential groove including
a first end portion positioned at one end side thereof in the circumferential direction, and
a second end portion positioned at an other end side thereof in the circumferential direction,
the second circumferential groove including
a third end portion positioned at the one end side thereof in the circumferential direction, and
a fourth end portion positioned at the other end side thereof in the circumferential direction,
the third circumferential groove including
a fifth end portion positioned at the one end side thereof in the circumferential direction, and
a sixth end portion positioned at the other end side thereof in the circumferential direction,
the third end portion and the fourth end portion do not overlap the first end portion in the radial direction,
the fifth end portion and the sixth end portion do not overlap the third end portion in the radial direction.

10. The chuck according to claim 9, wherein
a distance to the first hole from an intersection between the first radial-direction groove and the first circumferential groove is equal to a distance to the second hole from an intersection between the second radial-direction groove and the second circumferential groove.

11. The chuck according to claim 9, wherein
the third end portion and the fourth end portion do not overlap the second end portion in the radial direction.

12. The chuck according to claim 9, wherein
the first circumferential groove includes a central region that includes a center of the first circumferential groove in the circumferential direction, and
the third end portion overlaps the central region in the radial direction.

13. The chuck according to claim 12, wherein
the third end portion is positioned closer to the second end portion in the circumferential direction than to the first end portion in the circumferential direction.

14. The chuck according to claim 13, wherein
the fourth end portion does not overlap the first circumferential groove in the radial direction.

15. The chuck according to claim 9, further comprising:
a heater which heats the ceramic dielectric substrate.

16. A semiconductor manufacturing apparatus, comprising:
  the electrostatic chuck according to claim 9; and
  a gas supplier which supplies the cooling gas to the first and second holes via the gas inlet path.

* * * * *